US011329016B2

(12) United States Patent
Hsieh et al.

(10) Patent No.: US 11,329,016 B2
(45) Date of Patent: May 10, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Meng-Wei Hsieh, Kaohsiung (TW); Chieh-Chen Fu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 62 days.

(21) Appl. No.: 16/789,246

(22) Filed: Feb. 12, 2020

(65) Prior Publication Data
US 2021/0249369 A1    Aug. 12, 2021

(51) Int. Cl.
*H01L 23/48* (2006.01)
*H01L 23/52* (2006.01)
*H01L 29/40* (2006.01)
*H01L 23/66* (2006.01)
*H01L 23/498* (2006.01)
*H01Q 1/22* (2006.01)
*H01L 21/48* (2006.01)

(52) U.S. Cl.
CPC ............ *H01L 23/66* (2013.01); *H01L 21/486* (2013.01); *H01L 23/49827* (2013.01); *H01Q 1/2283* (2013.01); *H01L 2223/6677* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0024888 A1* | 2/2011 | Pagaila | ............... | H01L 25/0657 257/686 |
| 2011/0068459 A1* | 3/2011 | Pagaila | ................... | H01L 24/97 257/698 |
| 2014/0048906 A1* | 2/2014 | Shim | ...................... | H01L 21/561 257/531 |
| 2017/0084596 A1* | 3/2017 | Scanlan | ............... | H01L 21/4882 |
| 2020/0073207 A1* | 3/2020 | Okahisa | ................. | G03B 15/02 |

FOREIGN PATENT DOCUMENTS

CN       207517680 U       6/2018

* cited by examiner

*Primary Examiner* — Niki H Nguyen
(74) *Attorney, Agent, or Firm* — Foley & Lardner LLP

(57) ABSTRACT

A semiconductor device package includes a carrier, an emitting device, a first building-up circuit and a first package body. The carrier has a first surface, a second surface opposite to the first surface and a lateral surface extending from the first surface to the second surface. The emitting element is disposed on the first surface of carrier. The first building-up circuit is disposed on the second surface of the carrier. The first package body encapsulates the lateral surface of the carrier.

15 Claims, 30 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is commonly used in an AiP system. However, due to the process limitation of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes a carrier, an emitting device, a first building-up circuit and a first package body. The carrier has a first surface, a second surface opposite to the first surface and a lateral surface extending from the first surface to the second surface. The emitting element is disposed on the first surface of carrier. The first building-up circuit is disposed on the second surface of the carrier. The first package body encapsulates the lateral surface of the carrier.

In accordance with some embodiments of the present disclosure, a semiconductor device package includes a stand-off layer, an emitting element and a first building-up circuit. The stand-off layer has a first surface, a second surface opposite to the first surface and a lateral surface extending from the first surface to the second surface. The emitting element is disposed on the first surface of the stand-off layer. The first building-up circuit is disposed on the second surface of the stand-off layer. A lateral surface of the first building-up circuit and the lateral surface of the stand-off layer are non-coplanar.

In accordance with some embodiments of the present disclosure, a method of manufacturing a semiconductor device package includes (a) providing a plurality of emitting devices separated from each other; (b) forming a first package body to cover lateral surfaces of the emitting devices; and (c) forming a first building-up circuit on the emitting devices.

Figure 1A:
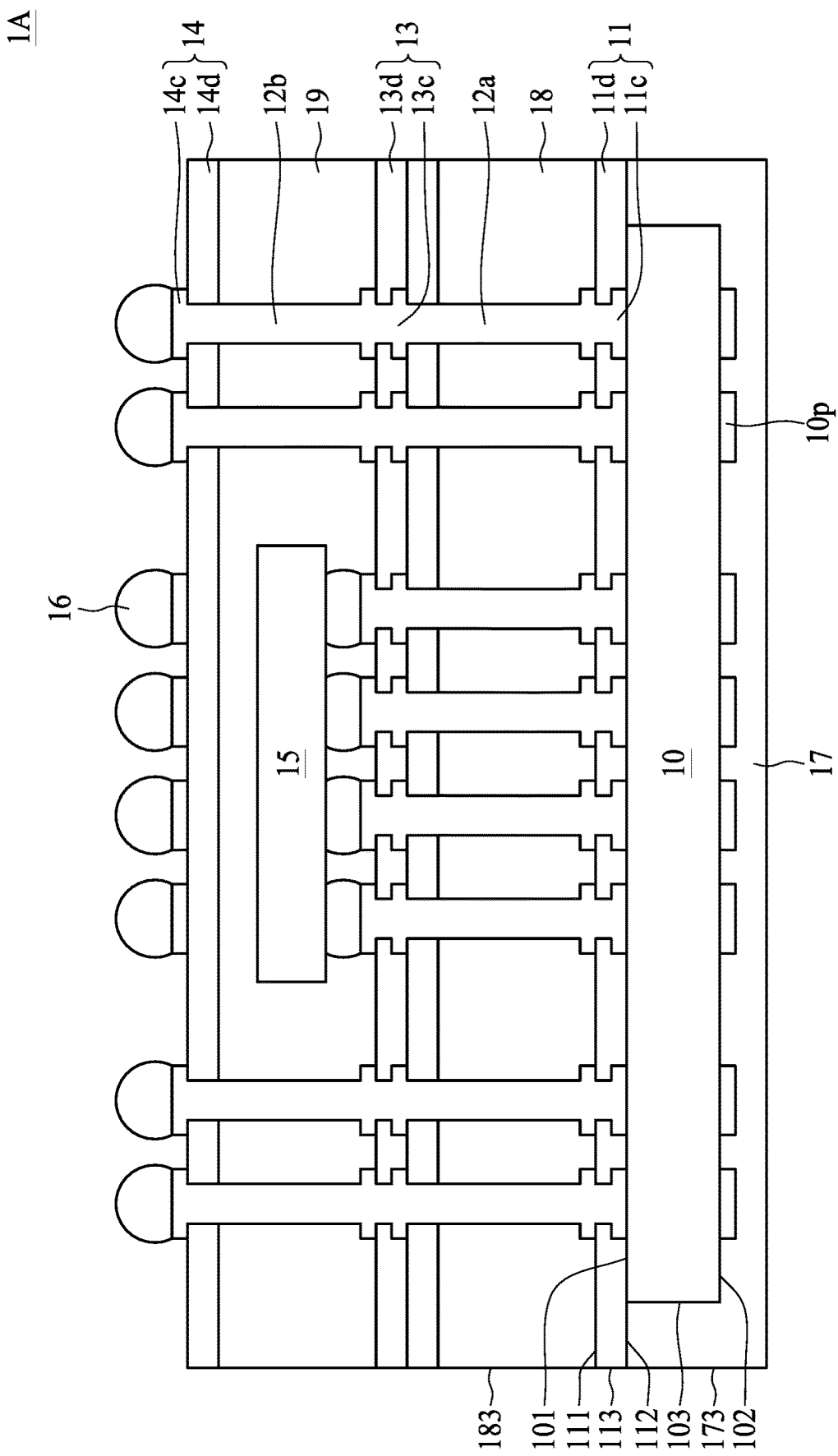
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1A in accordance with some embodiments of the present disclosure. The semiconductor device package 1A includes a carrier 10, circuit layers 11, 13, 14, interconnection structures 12a, 12b, an electronic component 15, electrical contacts 16 and package bodies 17, 18 and 19.

In some embodiments, the carrier 10 (also can be referred to as a stand-off layer) may be or include a glass substrate. In some embodiments, the carrier 10 may be or include an emitting device having one or more emitting components (e.g., an antenna, a light emitting device, a sensor or the like) disposed thereon. The carrier 10 may include conductive pad(s), trace(s), and interconnection(s) (e.g. via(s)). In some embodiments, the carrier 10 may include transparent material. In some embodiments, the carrier 10 may include opaque material. Compared to the organic substrate, it is easier to control the thickness of a glass carrier, which can facilitate the miniaturization of the semiconductor device package 1. The carrier 10 includes a material having a dielectric constant (Dk) less than approximately 5. The carrier 10 includes a material having a Dk less than approximately 3. The carrier 10 includes a material having a loss tangent or dissipation factor (Df) less than approximately 0.005. The carrier 10 includes a material having a loss tangent or Df less than approximately 0.003. In some embodiments, the thickness of the carrier 10 is about 400 μm. In some embodiments, a coefficient of thermal expansion (CTE) of the carrier 10 is in a range from about 0.5 to about 13. In some embodiments, the CTE of the carrier 10 is in a range from about 3.6 to about 8.5.

The carrier 10 has a surface 101, a surface 102 opposite to the surface 101 and a lateral surface 103 extending between the surface 101 and the surface 102. A conductive layer 10p is disposed on the surface 102 of the carrier 10. In some embodiments, the conductive layer 10p defines a patterned antenna, such as a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the conductive layer 10p may be replaced by one or more light emitting devices or sensors.

The circuit layer 11 (or building-up circuit) has a surface 111 facing away from the carrier 10, a surface 112 opposite to the surface 111 and a lateral surface 113 extending between the surface 111 and the surface 112. The carrier 10 is disposed on the surface 112 of the circuit layer 11. The carrier 10 is connected to the surface 112 of the circuit layer 11. The carrier 10 is in contact with the surface 112 of the circuit layer 11. In some embodiments, the lateral surface 113 of the circuit layer 11 and the lateral surface 103 of the carrier 10 are noncoplanar or discontinuous. For example, the lateral surface 103 of the carrier 10 is recessed from the lateral surface 113 of the circuit layer 11. For example, a width of the carrier 10 is less than a width of the circuit layer 11.

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. In some embodiments, a surface of the conductive layer 11c facing the carrier 10 and exposed from the dielectric layer 11d is in contact with the surface 101 of the carrier 10. In some embodiments, the conductive layer 11c may be or include one or more antenna patterns, light emitting devices, sensors or the like.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c depending on design specifications. In some embodiments, the conductive layer 11c is formed of or includes Au, Ag, Cu, Pt, Pd, or an alloy thereof.

The package body 17 is disposed on the surface 112 of the circuit layer 11. The package body 17 covers the carrier 10 and the conductive layer 10p. The package body 17 covers the surface 102 and the lateral surface 103 of the carrier 10. In some embodiments, the package body 17 has a lateral surface 173 substantially coplanar with the lateral surface 113 of the circuit layer 11. The lateral surface 103 of the carrier 10 is recessed from the lateral surface 173 of the package body 17. For example, there is a distance between the lateral surface 103 of the carrier 10 and the lateral surface 173 of the package body 17. In some embodiments, the package body 17 includes an epoxy resin including fillers, a molding compound (e.g., an epoxy molding compound or other molding compound), a polyimide, a phenolic compound or material, a material including a silicone dispersed therein, or a combination thereof.

One or more interconnection structures 12a (e.g., conductive pillars or conductive elements) are disposed on the surface 111 of the circuit layer 11. The interconnection structures 12a are electrically connected to the circuit layer 11 (i.e., to the conductive layer 11c exposed from the dielectric layer 11d). In some embodiments, the interconnection structures 12a define an antenna structure. The interconnection structure 12a is, or includes, a conductive material such as a metal or metal alloy. Examples of the conductive material include Au, Ag, Cu, Pt, Pd, or an alloy thereof.

The package body 18 is disposed on the surface 111 of the circuit layer 11. The package body 18 covers the interconnection structures 12a. In some embodiments, the package body 18 has a lateral surface 183 substantially coplanar with the lateral surface 113 of the circuit layer 11. In some embodiments, the package body 18 includes an epoxy resin including fillers, a molding compound (e.g., an epoxy molding compound or other molding compound), a polyimide, a phenolic compound or material, a material including a silicone dispersed therein, or a combination thereof.

The circuit layer 13 (or building-up circuit) is disposed on the package body 18. The circuit layer 13 has one or more dielectric layers 13d and one or more conductive layers 13c. In some embodiments, the dielectric layer 13d may include the same material as the dielectric layer 11d. Alternatively, the dielectric layer 13d and the dielectric layer 11d may include different materials. The conductive layer 13c is electrically connected to the interconnection structures 12a. In some embodiments, there may be any number of conductive layers 13c depending on design specifications.

One or more interconnection structures 12b (e.g., conductive pillars or conductive elements) are disposed on a surface of the circuit layer 13 facing away from the circuit layer 11. The interconnection structures 12b are electrically connected to the circuit layer 13. The interconnection structure 12b is, or includes, a conductive material such as a metal or metal alloy. Examples of the conductive material include Au, Ag, Cu, Pt, Pd, or an alloy thereof.

The electronic component 15 is disposed on a surface of the circuit layer 13 facing away from the circuit layer 11. The electronic component 15 may be an active electronic component, such as an integrated circuit (IC) chip or a die. The active surface of the electronic component 15 faces the circuit layer 13. The electronic component 15 is electrically connected to the circuit layer 13 (e.g., to the conductive layer 13c) through electrical contacts (e.g., solder balls), and the electrical connection can be achieved by, for example, flip-chip technique.

The package body 19 is disposed on the surface of the circuit layer 13 facing away from the circuit layer 11. The package body 19 covers the interconnection structures 12b and the electronic component 15. In some embodiments, the package body 19 has a lateral surface substantially coplanar with the lateral surface of the circuit layer 13. In some embodiments, the package body 19 includes an epoxy resin including fillers, a molding compound (e.g., an epoxy molding compound or other molding compound), a polyimide, a phenolic compound or material, a material including a silicone dispersed therein, or a combination thereof.

The circuit layer 14 (or building-up circuit) is disposed on the package body 19. The circuit layer 14 has one or more dielectric layers 14d and one or more conductive layers 14c. In some embodiments, the dielectric layer 14d may include the same material as the dielectric layer 11d. Alternatively, the dielectric layer 14d and the dielectric layer 11d may include different materials. The conductive layer 14c is electrically connected to the interconnection structures 12b. In some embodiments, there may be any number of conductive layers 14c depending on design specifications.

The electrical contacts 16 are disposed on the conductive layer 14c exposed from the dielectric layer 14d. In some embodiments, the electrical contacts 16 may include solder or other suitable material(s).

In some embodiments, the lateral surface 103 of the carrier 10 may be coplanar with the lateral surface 113 of the circuit layer 11. For example, the lateral surface 103 of the carrier 10 is exposed from the package body 17. Such structure may be formed by: (i) providing a glass wafer; (ii) forming the circuit layers 11, 13, 14, the interconnection structures 12a, 12b and the package bodies 17, 18, 19 and the electronic component 15 on the glass wafer; and (iii) performing a singulation through the circuit layers 11, 13, 14, the package bodies 17, 18, 19 and the carrier wafer. To meeting the requirement of the performance of the antenna structure, the glass wafer should select a material having a relatively low Dk (e.g., less than 5). However, a glass wafer having a relatively low Dk would have a relatively low CTE as well (e.g., less than 13). Due to a CTE mismatch between the glass wafer and the package body 17 (e.g., the package body generally has a CTE greater than 20), the warpage issues would occur. As the size of the glass wafer increases, the warpage issue becomes severer, which may result in the crack or damage of the glass wafer.

In accordance with the embodiments as shown in FIG. 1A, the lateral surface 103 of the carrier 10 is recessed from the lateral surface 111 of the circuit layer 11. Such structure may be formed by (detailed operations would be described later): (i) performing a singulation for a glass wafer to divide the glass wafer into a plurality glass carriers (e.g., the carrier 10 as shown in FIG. 1A); (ii) attaching the glass carriers on a release film (the glass carriers being separated from each other); and (iii) forming the circuit layers 11, 13, 14, the interconnection structures 12a, 12b and the package bodies 17, 18, 19 and the electronic component 15 on the glass carriers. Since the size of the divided glass carrier is much less than that of the glass wafer, the warpage issue can be significantly mitigated. In addition, since it is unnecessary to select a material of the carrier 10 having a higher CTE to be close to the CTE of the package body 17, materials having lower CTE (also having lower Dk) can be selected as the carrier 10. This would enhance the performance of the antenna structure of the semiconductor device package 1A. Furthermore, the thickness of the carrier 10 can be reduced as well, which would facilitate the miniaturization of the semiconductor device package 1A.

Figure 1B:
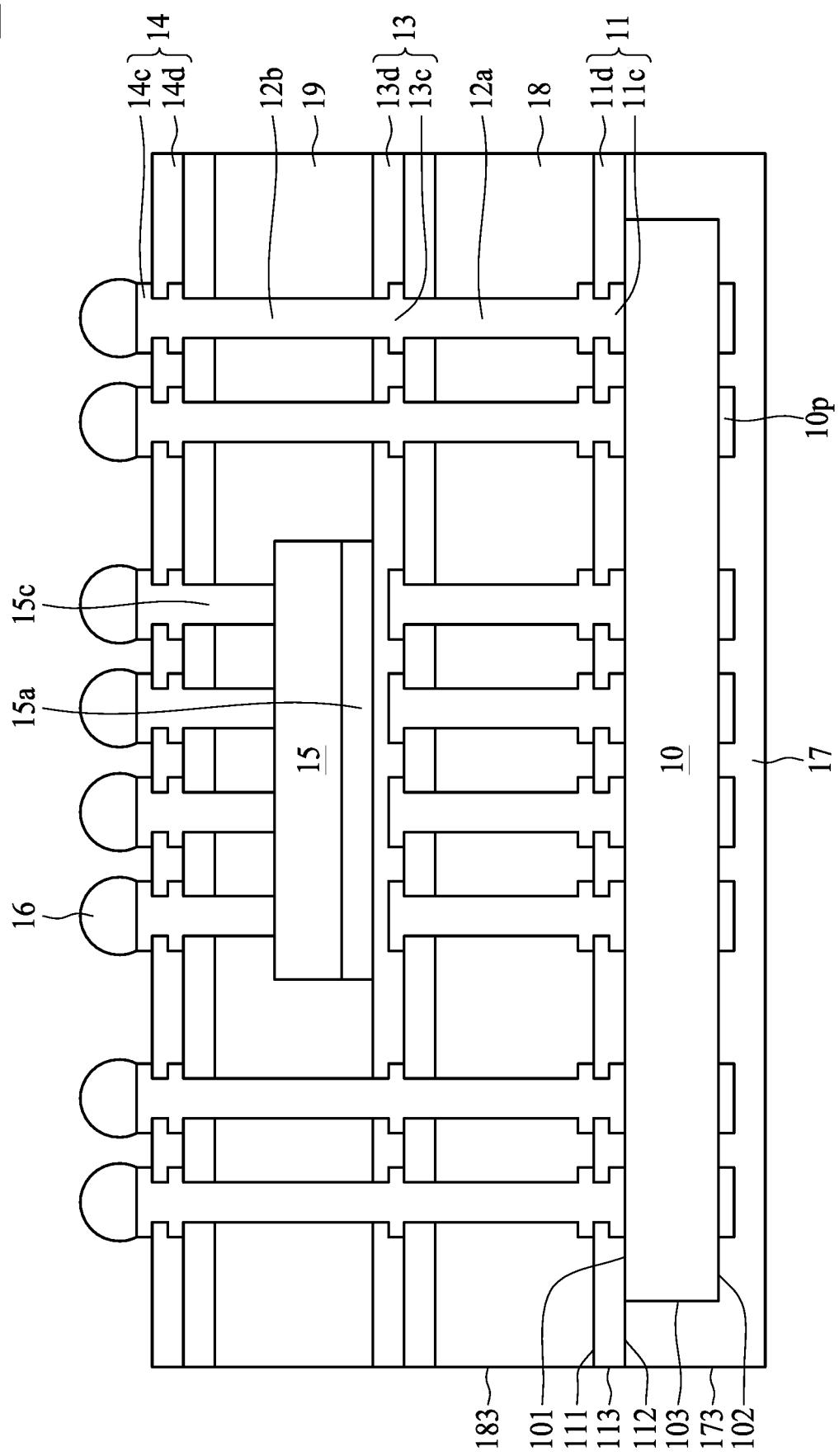
FIG. 1B illustrates a cross-sectional view of a semiconductor device package in accordance with some embodiments of the present disclosure.

FIG. 1B illustrates a cross-sectional view of a semiconductor device package 1B in accordance with some embodiments of the present disclosure. The semiconductor device package 1B is similar to the semiconductor device package 1A as shown in FIG. 1A, and the differences therebetween are described below.

The electronic component 15 is disposed on the surface of the circuit layer 13 facing the circuit layer 14. The electronic component 15 has a backside surface bonded or attached to the surface of the circuit layer 13 by an adhesion layer 15a (e.g., DAF). The electronic component 15 has an active surface facing the circuit layer 14 and electrically connected to the circuit layer 14 through the interconnection structures 15c (e.g., conducive pillars).

Figure 2A:
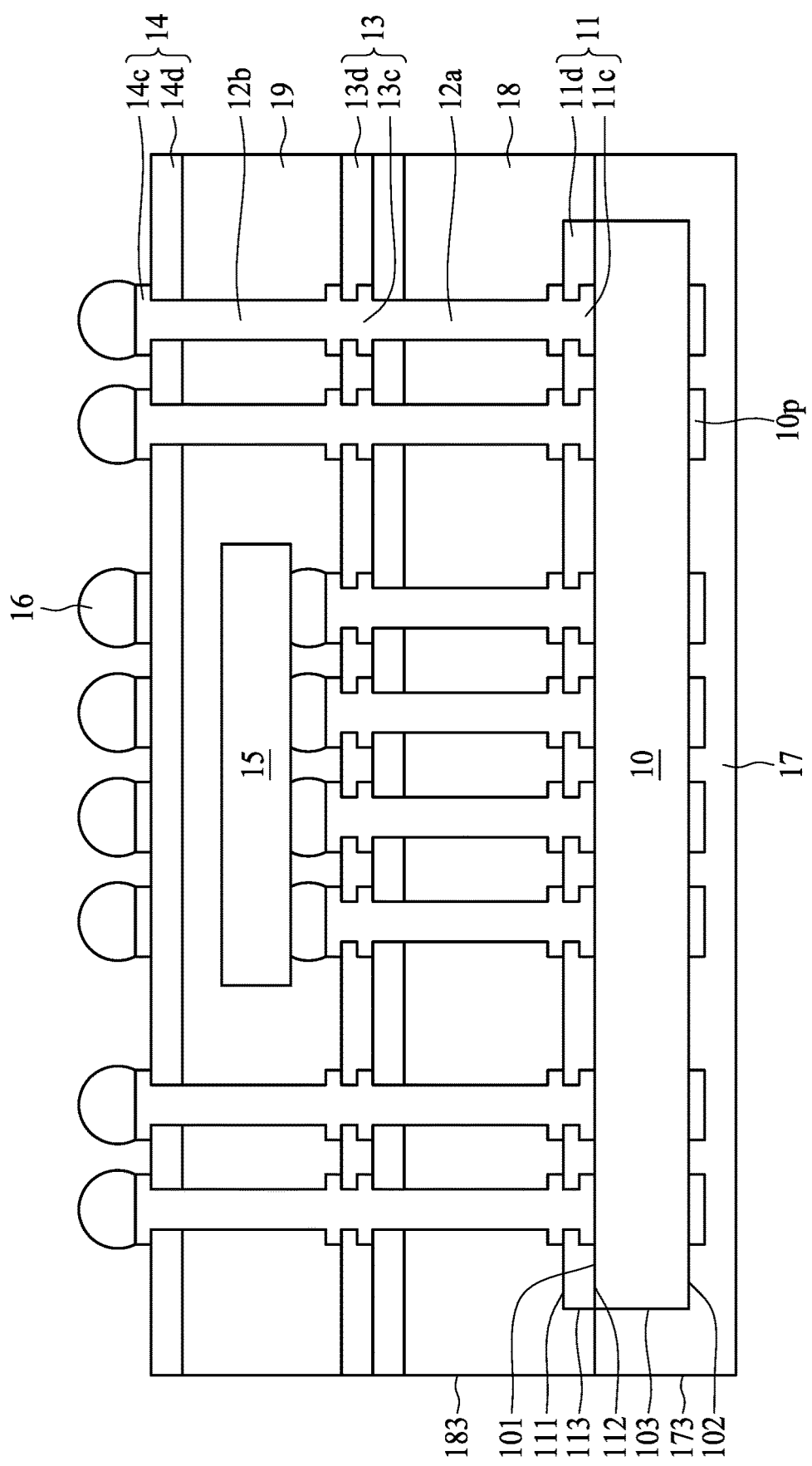
FIG. 2A illustrates a cross-sectional view of a semiconductor device package in accordance with some embodiments of the present disclosure.

FIG. 2A illustrates a cross-sectional view of a semiconductor device package 2A in accordance with some embodiments of the present disclosure. The semiconductor device package 2A is similar to the semiconductor device package 1A as shown in FIG. 1A, and the differences therebetween are described below.

The lateral surface 113 of the circuit layer 11 is recessed from the lateral surface 173 of the package body 17 or the lateral surface 183 of the package body 18. For example, there is a gap between the lateral surface 113 of the circuit layer 11 and the lateral surface of the lateral surface 183 of the package body 18. For example, the lateral surface 113 of the circuit layer 11 is covered by the package body 18. For example, a width of the circuit layer 11 is less than a width of the package body 18. The package body 18 may directly contact the package body 18.

Figure 2B:
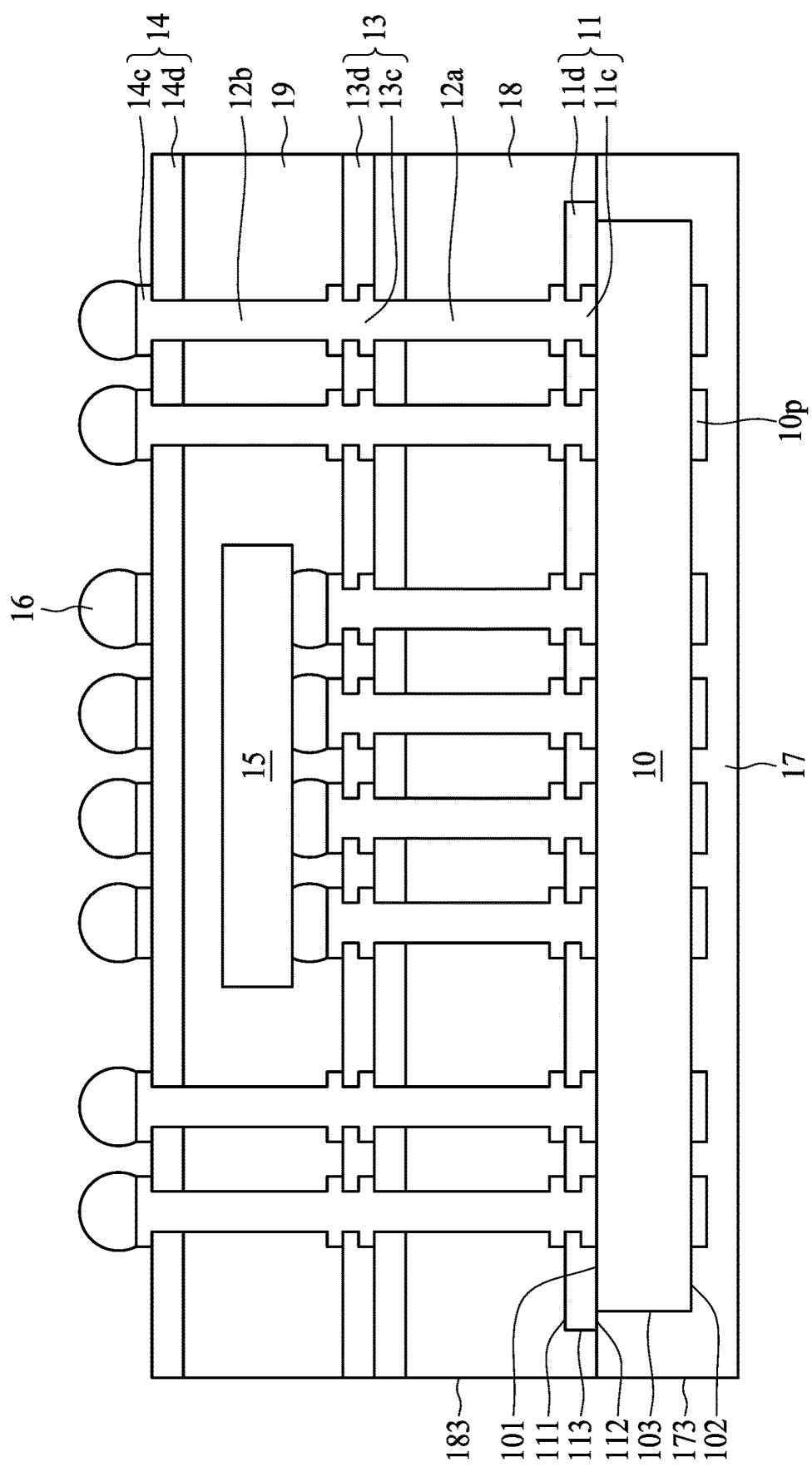
FIG. 2B illustrates a cross-sectional view of a semiconductor device package in accordance with some embodiments of the present disclosure.

In some embodiments, the lateral surface 113 of the circuit layer 11 may be substantially coplanar with the lateral surface 103 of the carrier 10 as shown in FIG. 2A. For example, a width of the circuit layer 11 is substantially the same as a width of the carrier 10. In some embodiments, the lateral surface 113 of the circuit layer 11 is noncoplanar with the lateral surface 103 of the carrier 10 and the lateral surface 183 of the package body 18 as shown in FIG. 2B, which illustrates a cross-sectional view of a semiconductor device package 2B. For example, a width of the circuit layer 11 is greater than a width of the carrier 10 and less than a width of the package body 18.

Figure 2C:
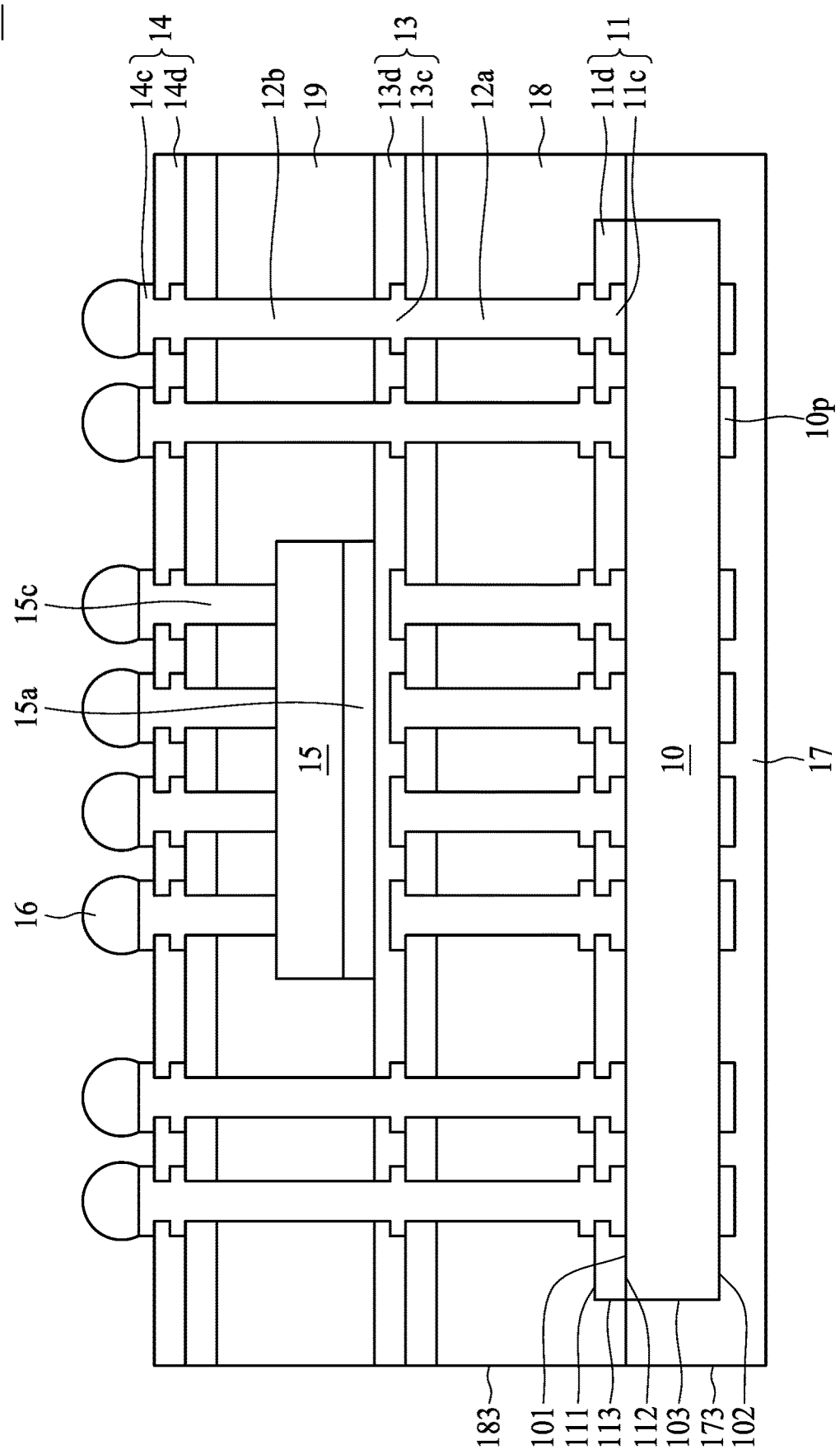
FIG. 2C illustrates a cross-sectional view of a semiconductor device package in accordance with some embodiments of the present disclosure.

FIG. 2C illustrates a cross-sectional view of a semiconductor device package 2C in accordance with some embodiments of the present disclosure. The semiconductor device package 2C is similar to the semiconductor device package 2A as shown in FIG. 2A, and the differences therebetween are described below.

The electronic component 15 is disposed on the surface of the circuit layer 13 facing the circuit layer 14. The electronic component 15 has a backside surface bonded or attached to the surface of the circuit layer 13 by the adhesion layer 15a (e.g., DAF). The electronic component 15 has an active surface facing the circuit layer 14 and electrically connected to the circuit layer 14 through the interconnection structures 15c (e.g., conducive pillars).

Figure 2D:
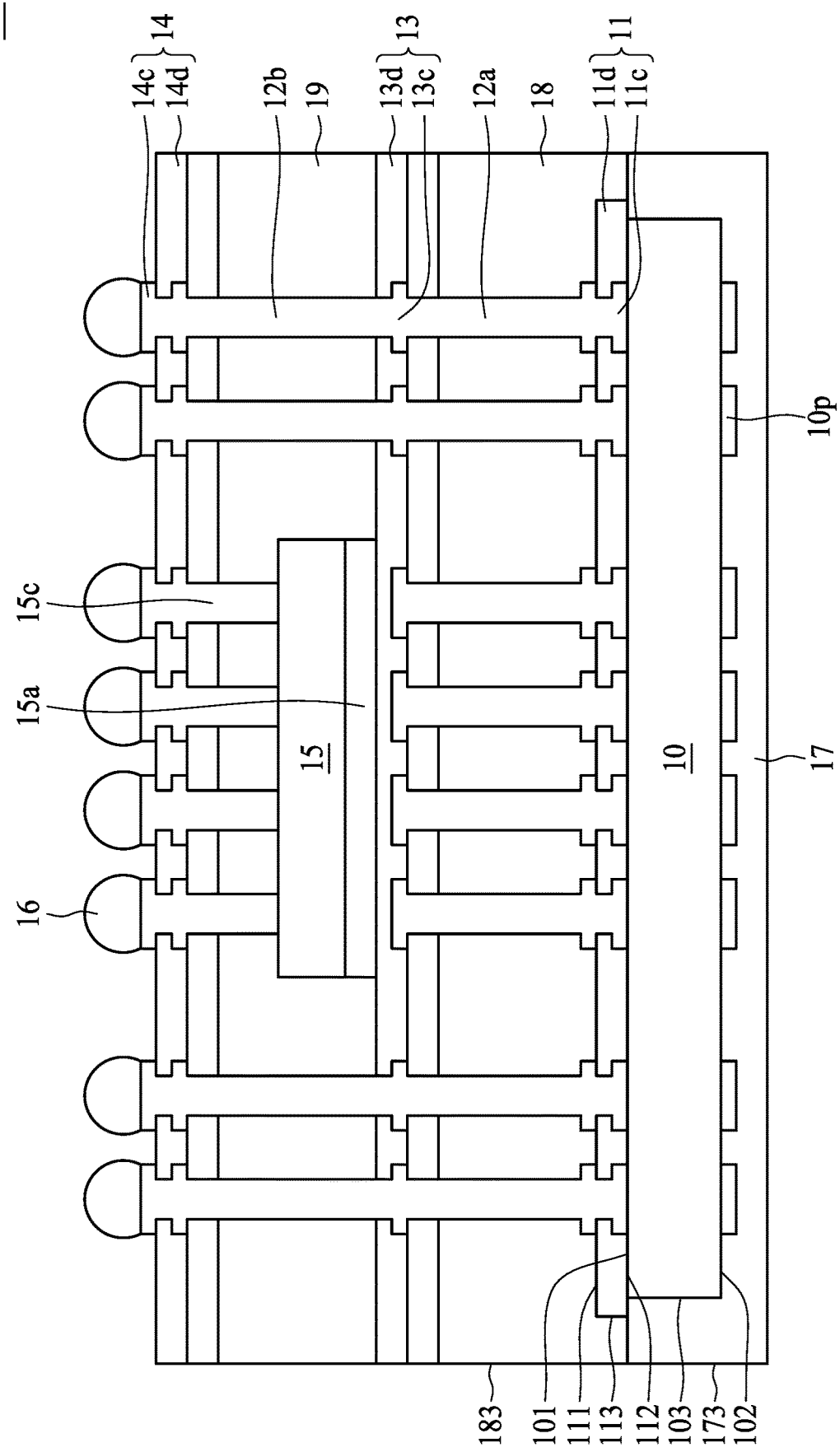
FIG. 2D illustrates a cross-sectional view of a semiconductor device package in accordance with some embodiments of the present disclosure.

FIG. 2D illustrates a cross-sectional view of a semiconductor device package 2D in accordance with some embodiments of the present disclosure. The semiconductor device package 2D is similar to the semiconductor device package 2B as shown in FIG. 2B, and the differences therebetween are described below.

The electronic component 15 is disposed on the surface of the circuit layer 13 facing the circuit layer 14. The electronic component 15 has a backside surface bonded or attached to the surface of the circuit layer 13 by the adhesion layer 15a (e.g., DAF). The electronic component 15 has an active surface facing the circuit layer 14 and electrically connected to the circuit layer 14 through the interconnection structures 15c (e.g., conducive pillars).

Figure 3:
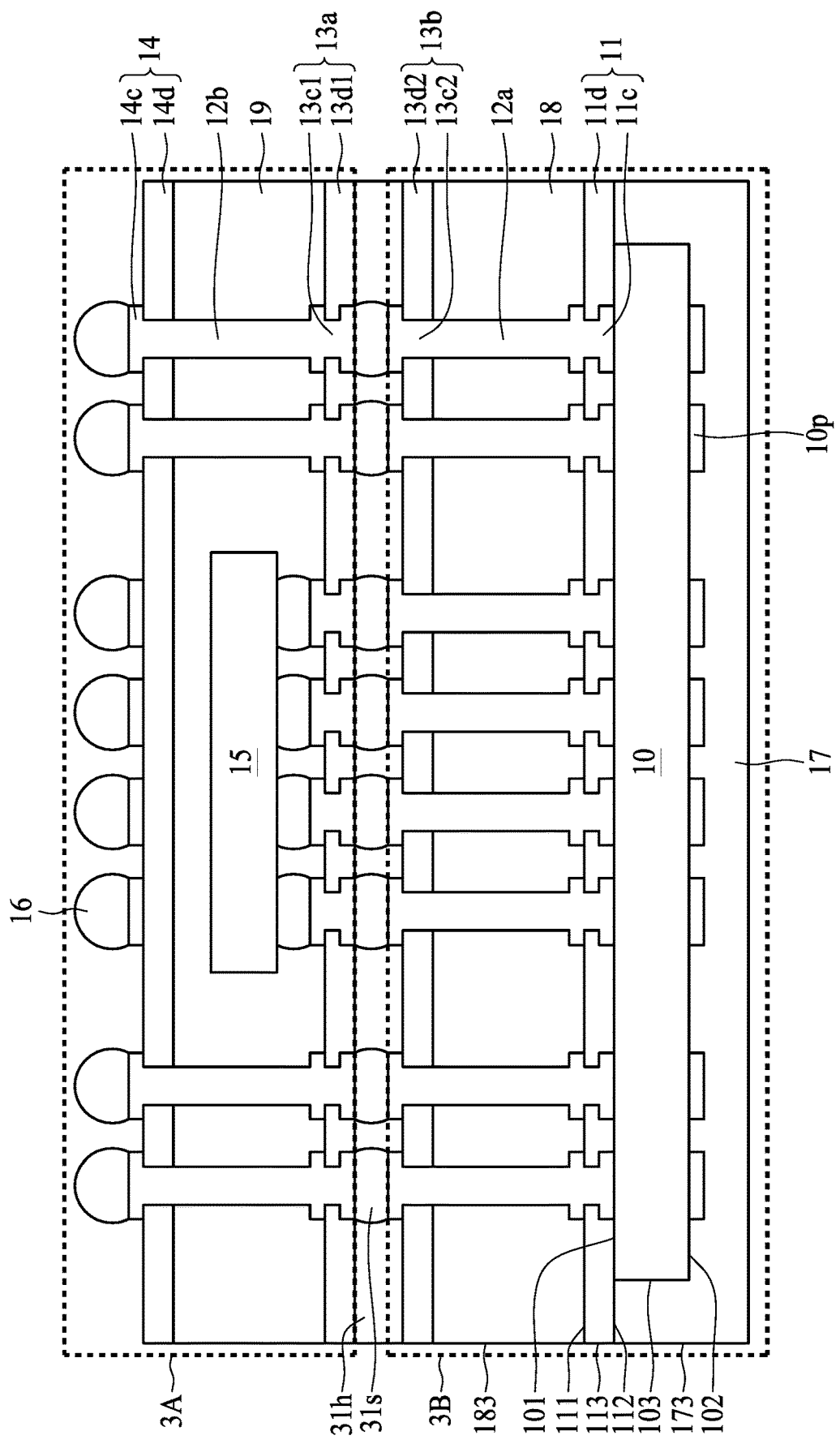
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1A as shown in FIG. 1A, and the differences therebetween are described below.

The semiconductor device package 3 may include two parts 3A and 3B. The part 3A includes a circuit layer 13a including one or more dielectric layers 13d1 and one or more conductive layers 13c1, the package body 19, the electronic component 15, the circuit layer 14, and the interconnection structures 12b. The part 3B includes a circuit layer 13b including one or more dielectric layers 13d2 and one or more conductive layers 13c2, the package bodies 17, 18, the circuit layer 11 and the carrier 10. The part 3A and the part 3B may be manufactured individually and then connected to each other through electrical contacts 31s (e.g., solder balls). This would increase the yield rate of the semiconductor device package 3. In some embodiments, an underfill 31h may be disposed between the part 3A and the part 3B to cover the electrical contacts 31s. In some embodiments, a width of the part 3A is the same as a width of the part 3B. Alternatively, the width of the part 3A may be greater than or less than the width of the part 3B depending on design specifications.

Figure 4:
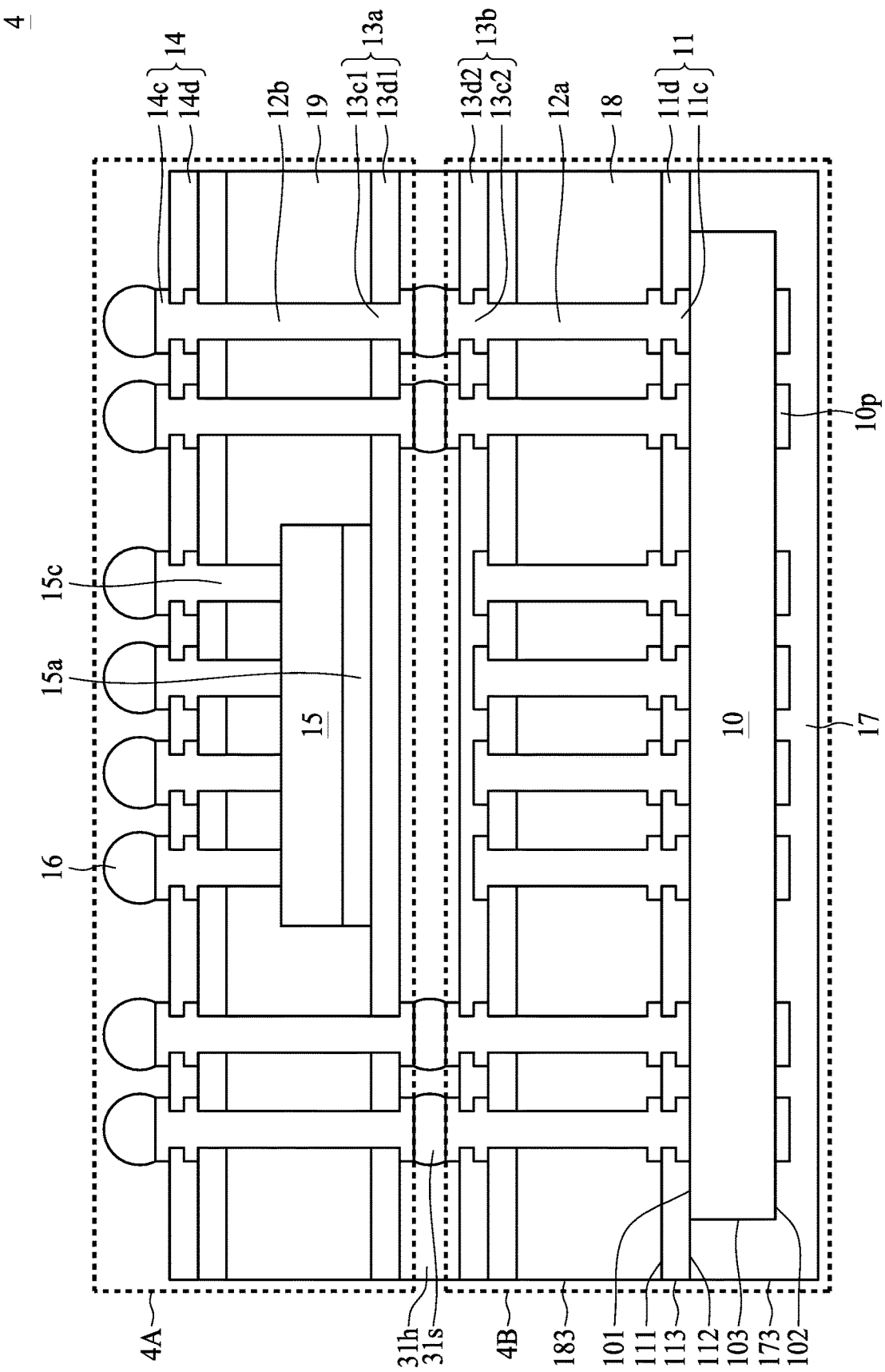
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 as shown in FIG. 3, and the differences therebetween are described below.

The electronic component 15 is disposed on the surface of the circuit layer 13a facing the circuit layer 14. The electronic component 15 has a backside surface bonded or attached to the surface of the circuit layer 13a by the adhesion layer 15a (e.g., DAF). The electronic component 15 has an active surface facing the circuit layer 14 and electrically connected to the circuit layer 14 through the interconnection structures 15c (e.g., conducive pillars).

Figure 5:
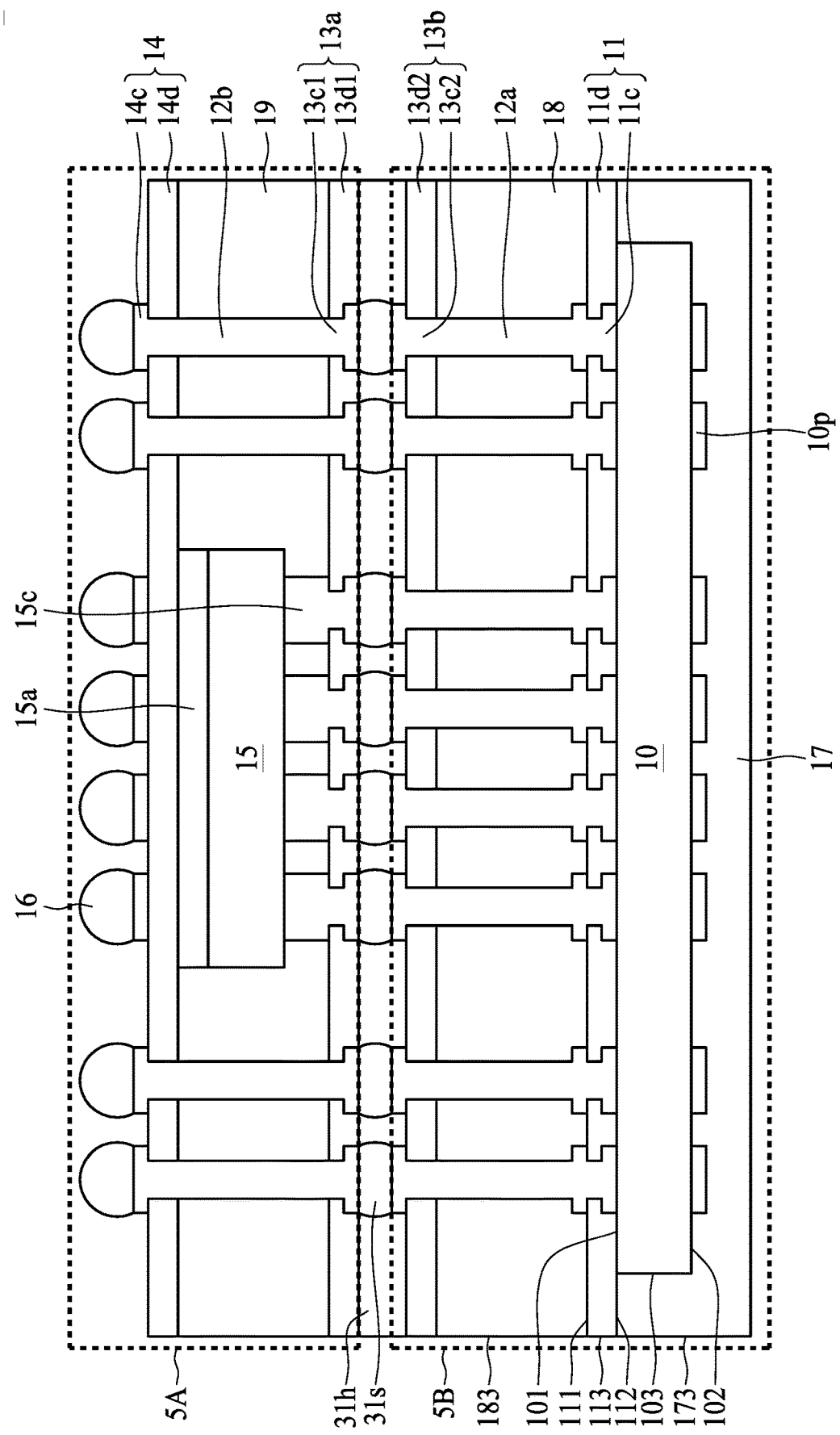
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 3 as shown in FIG. 3, and the differences therebetween are described below.

The electronic component 15 is disposed on the surface of the circuit layer 14 facing the circuit layer 13a. The electronic component 15 has a backside surface bonded or attached to the surface of the circuit layer 14 by the adhesion layer 15a (e.g., DAF). The electronic component 15 has an active surface facing the circuit layer 13a and electrically connected to the circuit layer 13a through the interconnection structures 15c (e.g., conducive pillars).

FIG. 6A, FIG. 6B, FIG. 6C, FIG. 6D, FIG. 6E, FIG. 6F, FIG. 6G, FIG. 6H and FIG. 6I illustrate a semiconductor manufacturing method in accordance with some embodiments of the present disclosure. In some embodiments, the method in FIG. 6A, FIG. 6B, FIG. 6C, FIG. 6D, FIG. 6E, FIG. 6F, FIG. 6G, FIG. 6H and FIG. 6I can be used to manufacture the semiconductor device package 1A in FIG. 1A.

Figure 6A:
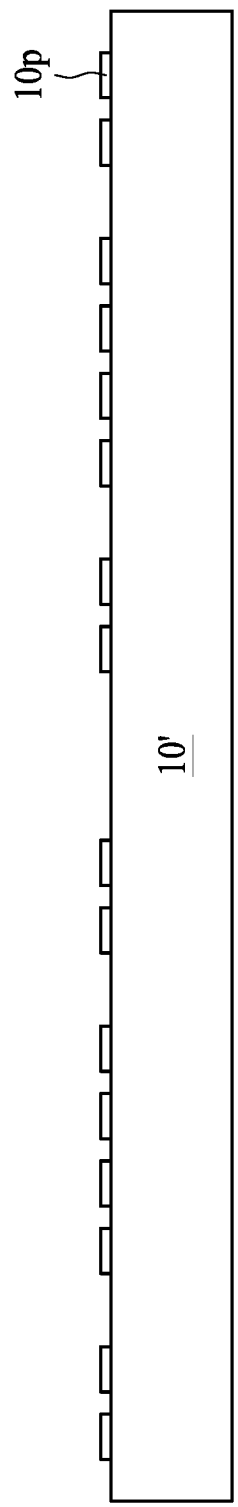
FIG. 6A, FIG. 6B, FIG. 6C, FIG. 6D, FIG. 6E, FIG. 6F, FIG. 6G, FIG. 6H and FIG. 6I illustrate a semiconductor manufacturing method in accordance with some embodiments of the present disclosure.

Referring to FIG. 6A, a carrier 10' is provided. The carrier 10' may be in a wafer type, a panel type or a strip type. In some embodiments, the carrier 10' may be a glass wafer. Conductive layers 10p are formed on the carrier 10'. In some embodiments, the conductive layers 10p may be antenna patterns, light emitting devices or sensors.

Figure 6B:
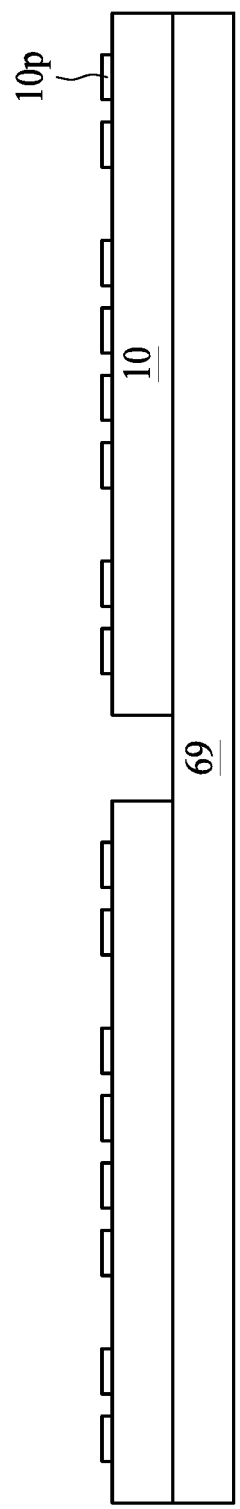

Referring to FIG. 6B, a singulation operation is carried out to divide the carrier 10' into a plurality of carriers including the carrier 10. The carriers including the carrier 10 are disposed on a release film 69. The carriers are separated from each other. For example, there is a gap or distance between any two adjacent carriers. A recon process is then carried out. In some embodiments, before the singulation operation, a thinning operation may be performed to reduce the thickness of the carrier 10' by, for example, grinding or any other suitable processes.

Figure 6C:
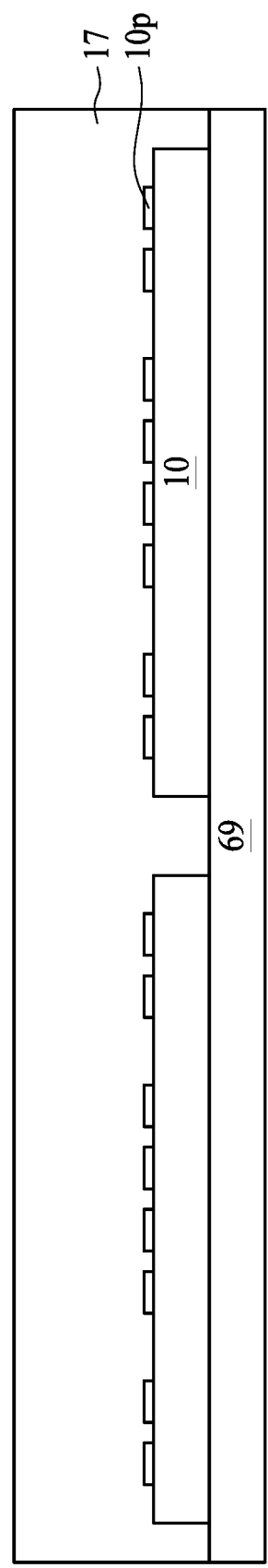

Referring to FIG. 6C, a package body 17 is form on the release film 69 to cover the carriers including the carrier 10 and the conductive layer 10p. In some embodiments, the package body 17 is formed by, for example, by a transfer molding technique, a compression technique or any other suitable techniques.

Figure 6D:
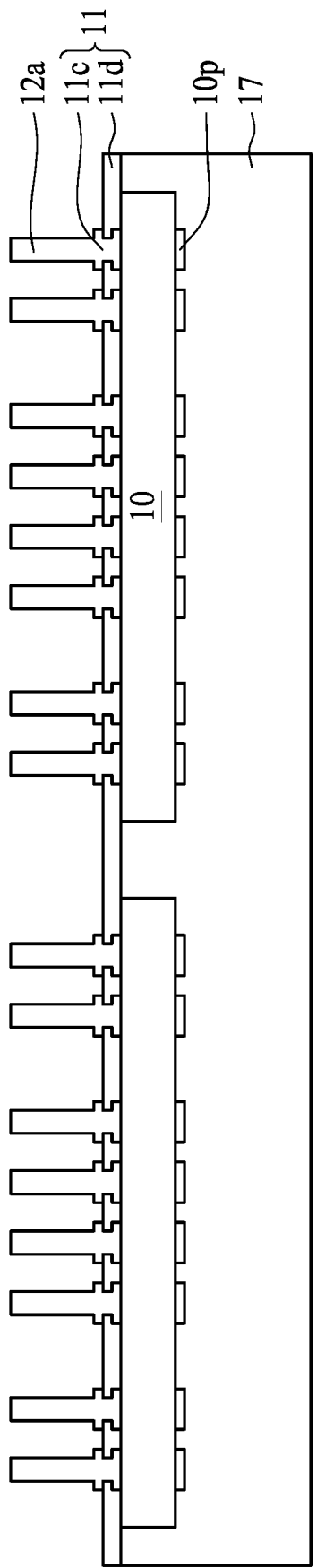

Referring to FIG. 6D, the release film 69 is removed to expose a surface of the carrier 10 facing away from the package body 17. A circuit layer 11 including one or more conductive layers 11c and one or more dielectric layers 11d is formed on the exposed surface of the carriers including the carrier 10. The dielectric layer 11d is formed by, for example but is not limited to, photolithographic technique. Interconnection structures 12a are then formed on the circuit layer 11 to be electrically connected to the circuit layer 11. In some embodiments, the interconnection structures 12a may be formed by, for example but is not limited to, plating technique.

Figure 6E:
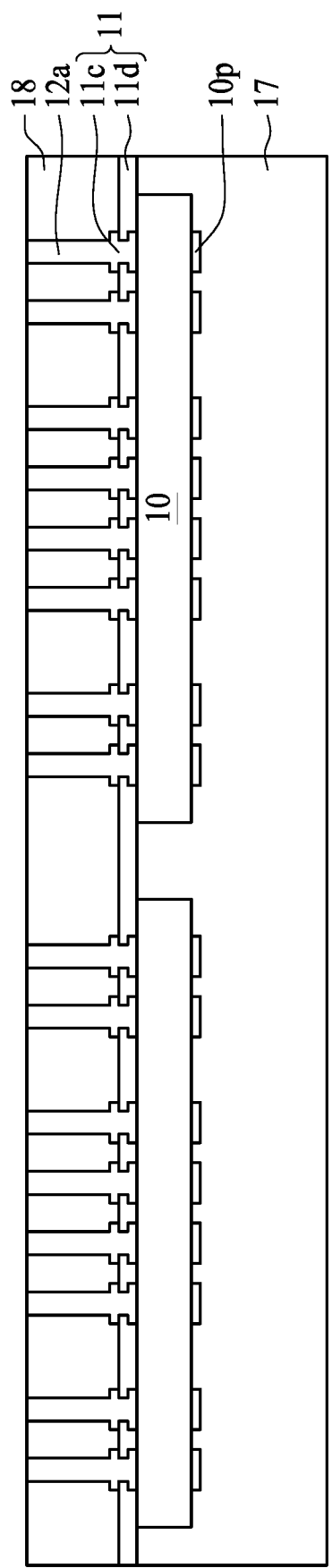
Figure 6F:
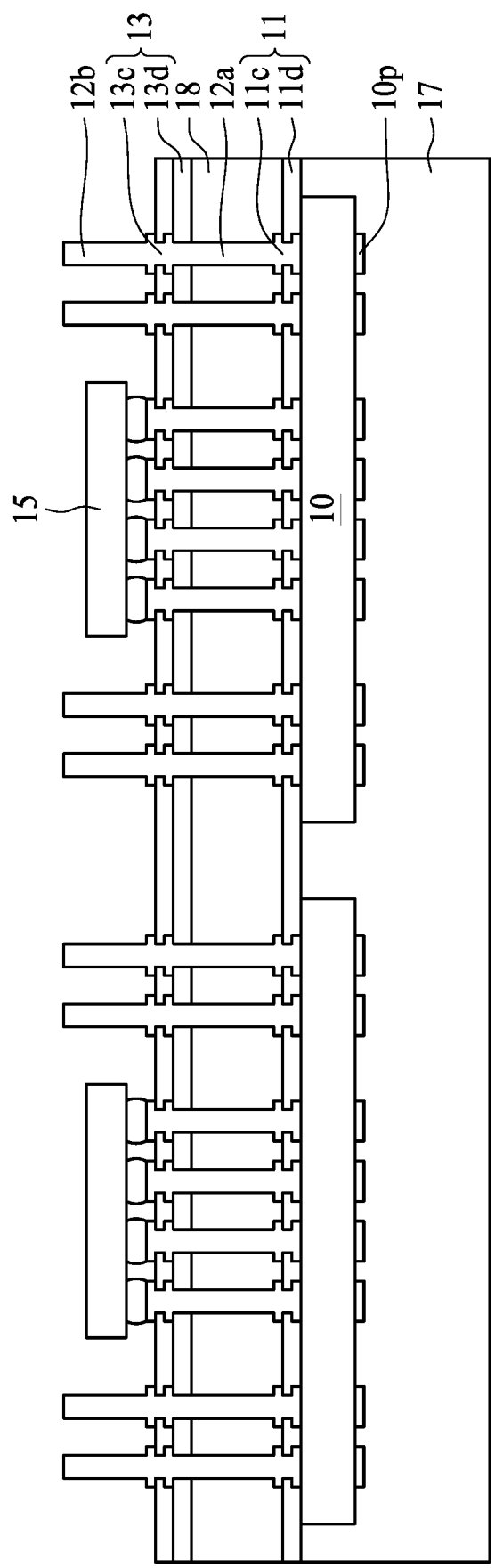

Referring to FIG. 6E, a package body 18 is form on the circuit layer 11 to cover the interconnection layers 12a. In some embodiments, the package body 18 may be formed to fully cover the interconnection structures 12a. A portion of the package body 18 is removed by, for example, grinding or any other suitable techniques to expose a top portion of the interconnection structures 12a for electrical connections. In some embodiments, the package body 18 is formed by, for example, by a transfer molding technique, a compression technique or any other suitable techniques.

Referring to FIG. 6E, a circuit layer 13 including one or more conductive layers 13c and one or more dielectric layers 13d is formed on the package body 18 and electrically connected to the interconnection structures 12a exposed from the package body 18. Interconnection structures 12b are formed on the circuit layer 13 to be electrically connected to the circuit layer 13. An electronic component 15 is then disposed on the circuit layer 13 and electrically connected to the circuit layer 13. In some embodiments, the electronic component 15 may be connected to the circuit layer 13 through flip-chip or any other suitable processes.

Figure 6G:
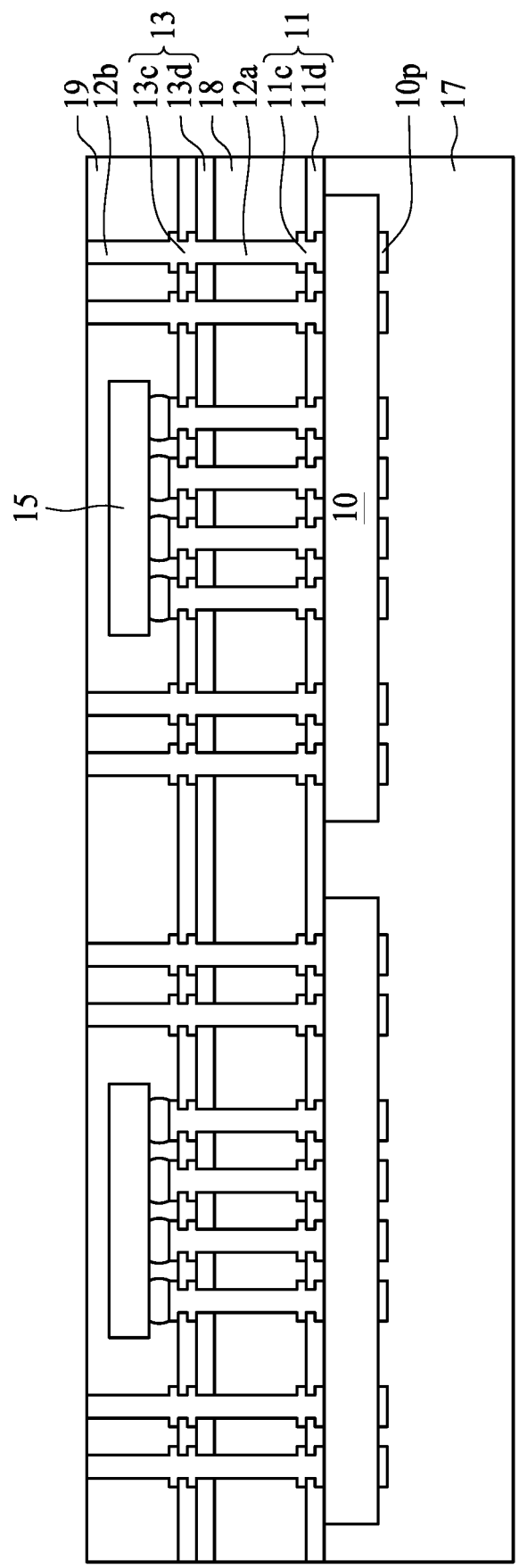

Referring to FIG. 6G, a package body 19 is formed on the circuit layer 13 to cover the interconnection structures 12b and the electronic component 15. In some embodiments, the package body 19 may be formed to fully cover the interconnection structures 12b and the electronic component 15. A portion of the package body 19 is removed by, for example, grinding or any other suitable techniques to expose a top portion of the interconnection structures 12b for electrical connections. In some embodiments, the package body 19 is formed by, for example, by a transfer molding technique, a compression technique or any other suitable techniques.

Figure 6H:
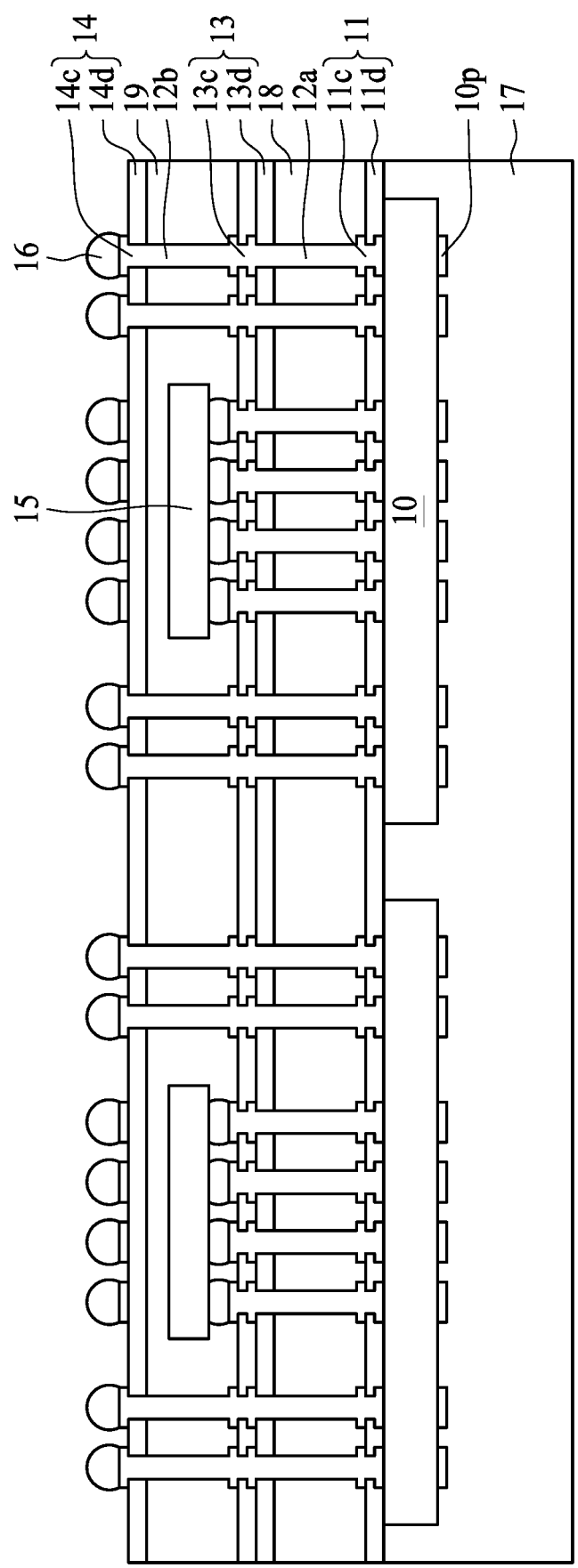

Referring to FIG. 6H, a circuit layer 14 including one or more conductive layers 14c and one or more dielectric layers 14d is formed on the package body 19 and electrically connected to the interconnection structures 12b exposed from the package body 19. Electrical contacts 16 are then disposed on the conductive layer 14c exposed from the dielectric layer 14d.

Figure 6I:
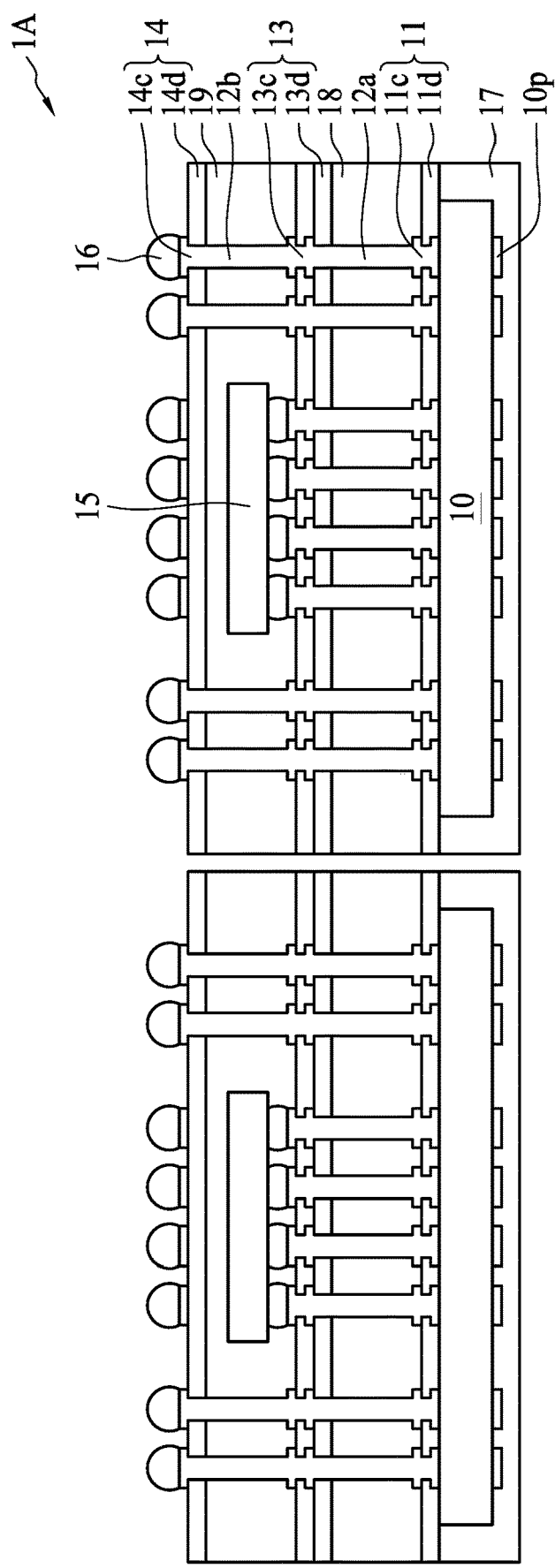

Referring to FIG. 6I, singulation may be performed to separate out individual semiconductor package devices including the semiconductor package device 1A as shown in FIG. 1A. That is, the singulation is performed through the circuit layers 11, 13, 14 and the package bodies 17, 18 and 19. The singulation may be performed, for example, by using a dicing saw, laser or other appropriate cutting technique.

FIG. 7A, FIG. 7B, FIG. 7C, FIG. 7D, FIG. 7E and FIG. 7F illustrate a semiconductor manufacturing method in accordance with some embodiments of the present disclosure. In some embodiments, the method in FIG. 7A, FIG. 7B, FIG. 7C, FIG. 7D, FIG. 7E and FIG. 7F can be used to manufacture the semiconductor device package 2A in FIG. 2A. The operation in FIG. 7A may be carried out after the operation in FIG. 6C. The operations as shown in FIG. 7A, FIG. 7B, FIG. 7C, FIG. 7D, FIG. 7E and FIG. 7F are similar to the operations as shown in FIG. 6D, FIG. 6E, FIG. 6F, FIG. 6G, FIG. 6H and FIG. 6I, and the differences therebetween are described below.

Figure 7A:
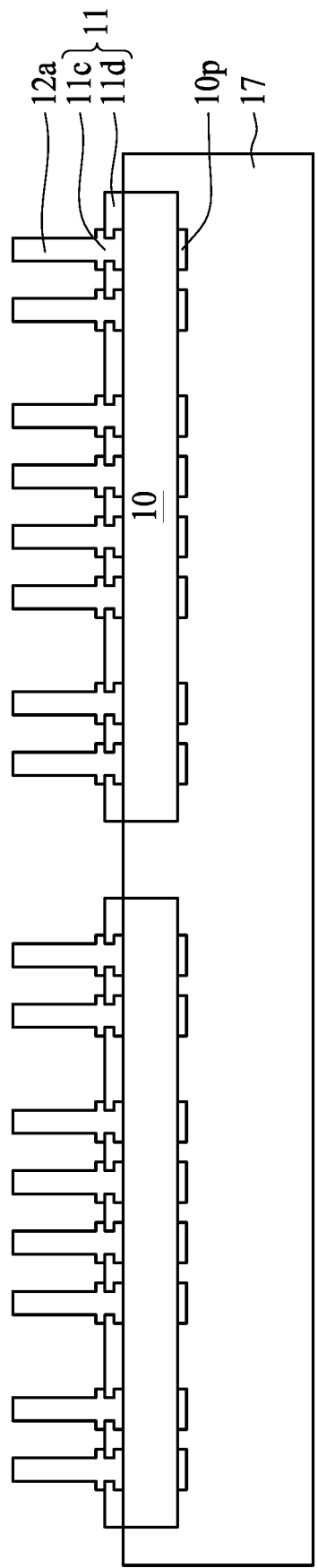
FIG. 7A, FIG. 7B, FIG. 7C, FIG. 7D, FIG. 7E and FIG. 7F illustrate a semiconductor manufacturing method in accordance with some embodiments of the present disclosure.

Referring to FIG. 7A, a plurality of circuit layers 11 each including one or more conductive layers 11c and one or more dielectric layers 11d are formed on the exposed surface of the carriers including the carrier 10. Each of the circuit layers 11 is formed on the corresponding carriers including the carrier 10. The circuit layers 11 are separated from each other. For example, there is a gap or distance between any two adjacent circuit layers 11. In some embodiments, a width of the circuit layer 11 is substantially the same as a width of the corresponding carrier. Alternatively, the width of the circuit layer 11 is greater than the width of the corresponding carrier.

Figure 7B:
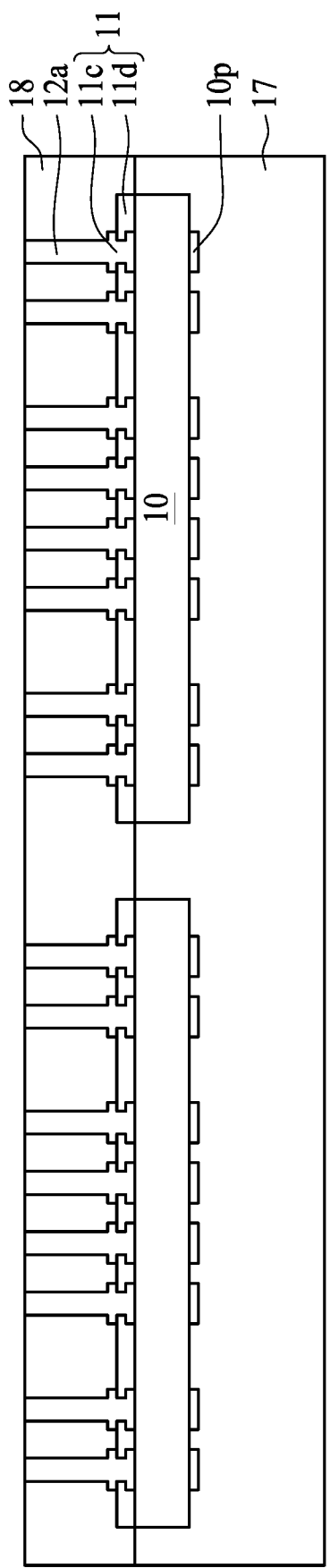
Figure 7C:
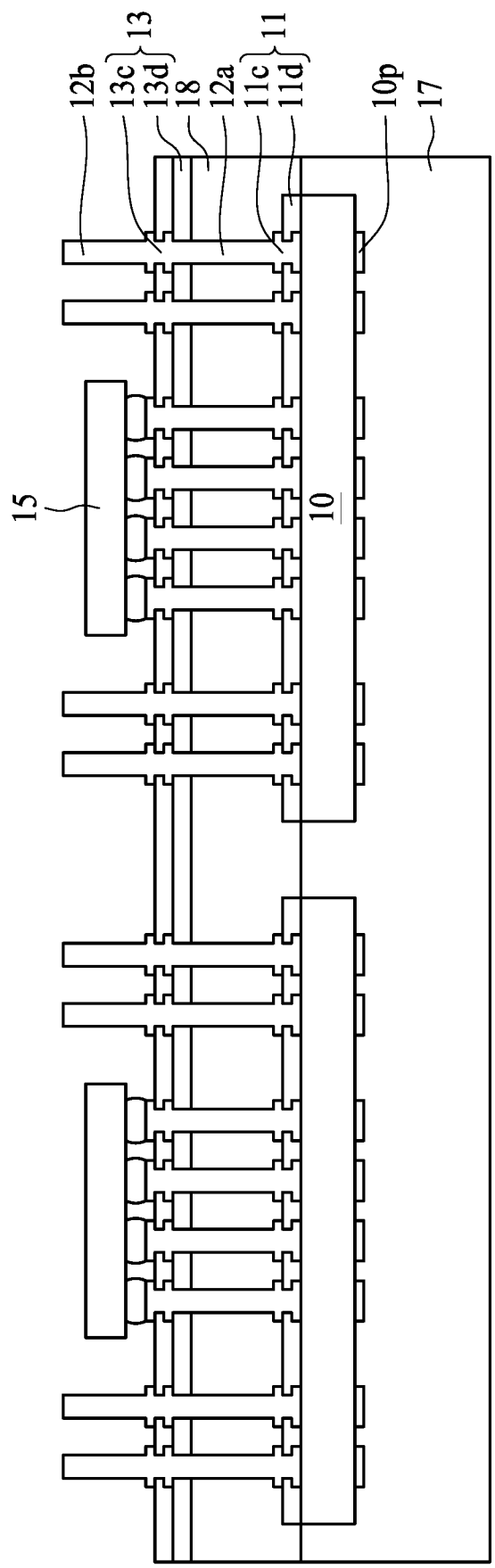
Figure 7D:
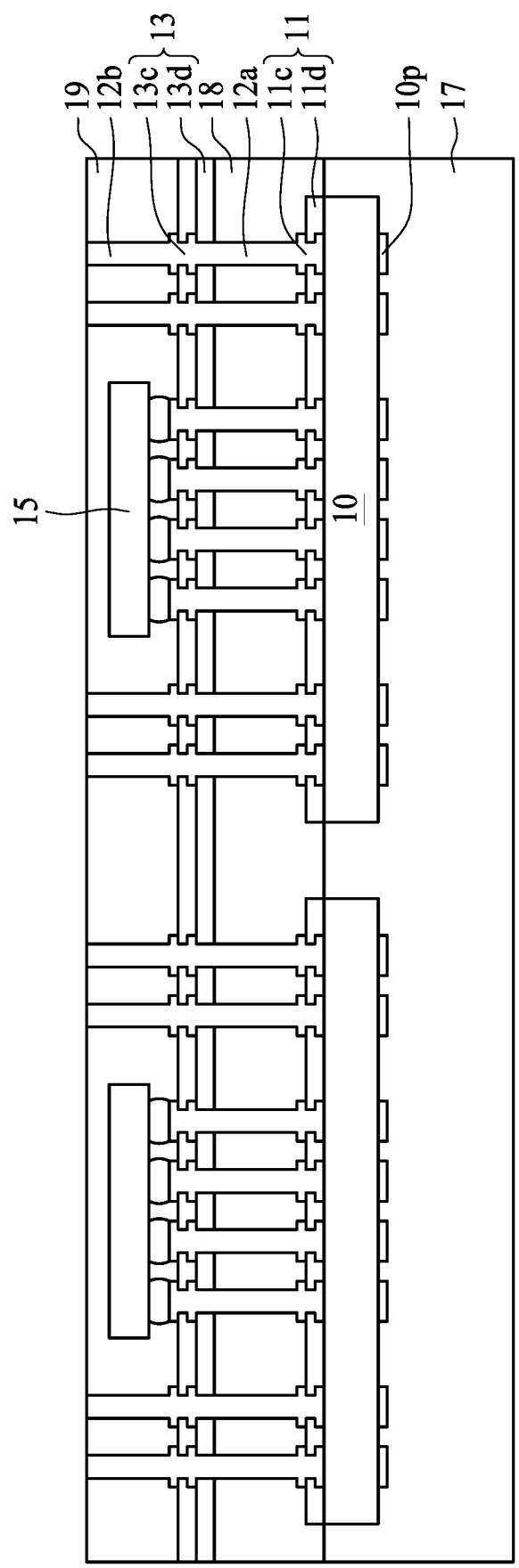
Figure 7E:
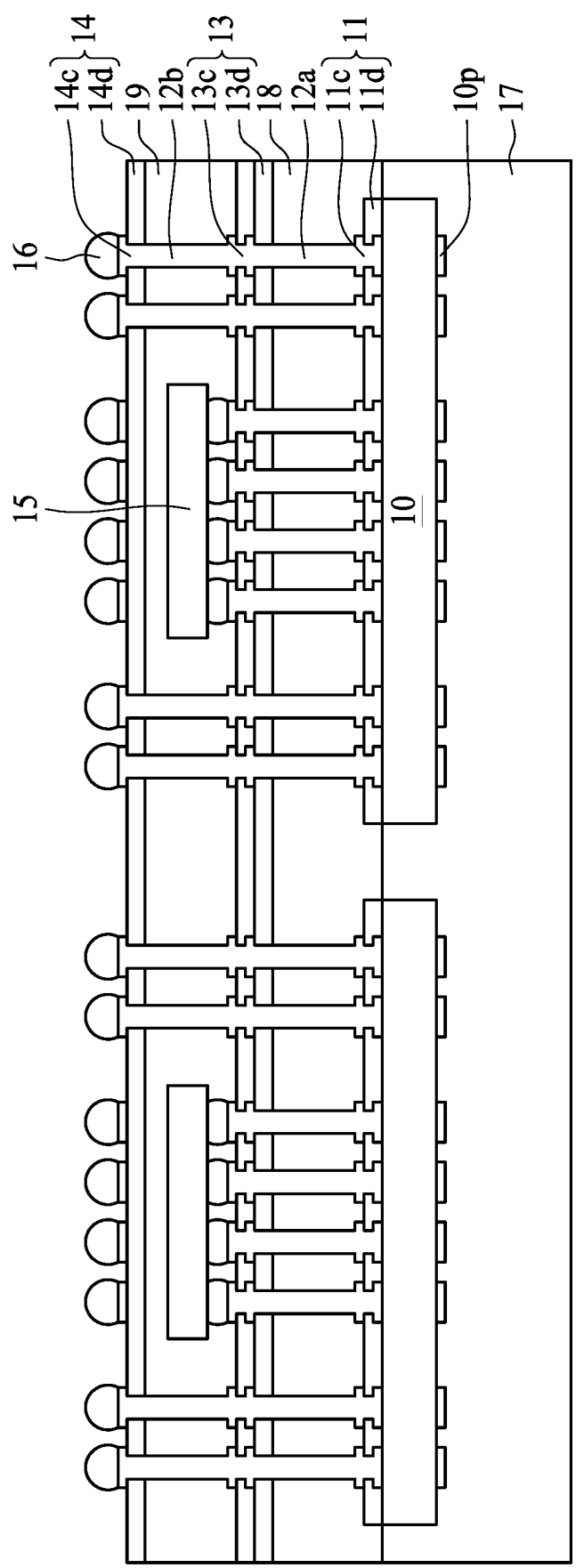

Referring to FIG. 7B, a package body 18 is formed on the circuit layer 11 and the package body 17 to cover the interconnection layers 12a. The package body 18 is in contact with the lateral surface of the circuit layer 11 and the package body 17.

Figure 7F:
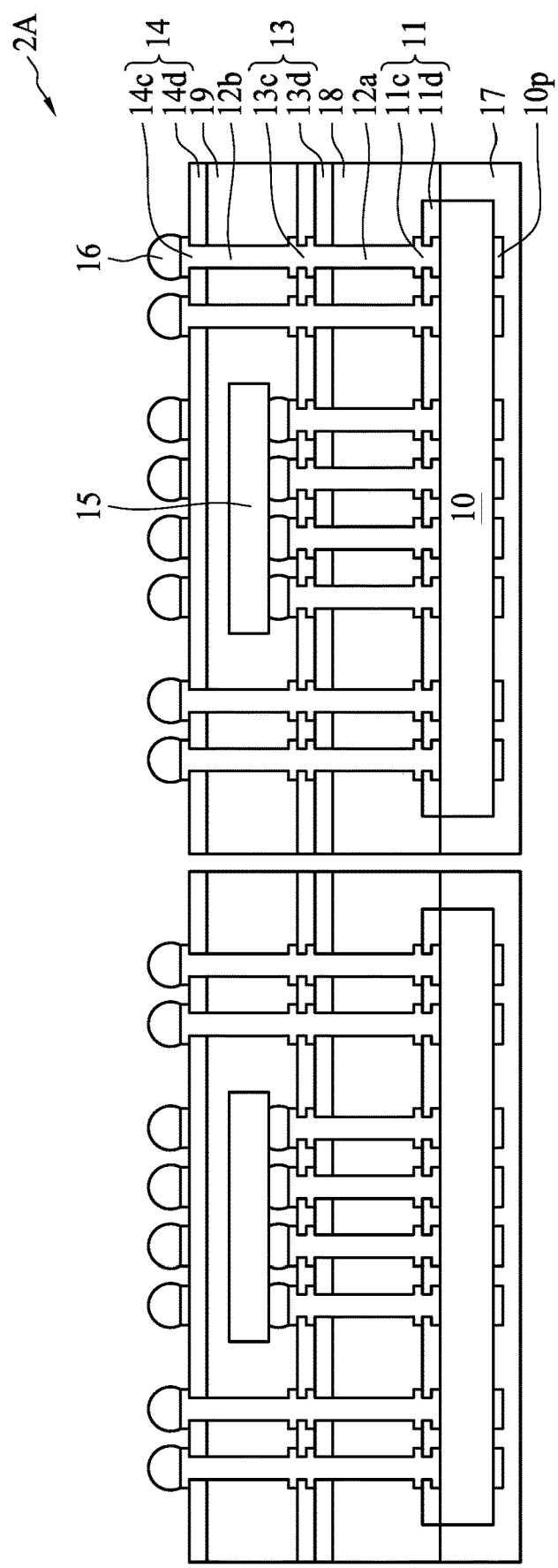

In accordance with the embodiments as shown in FIG. 7A, FIG. 7B, FIG. 7C, FIG. 7D, FIG. 7E and FIG. 7F, by forming the circuit layers 11, which are separated from each other on the corresponding carriers, the circuit layers 11 would not be located at the scribe line. Hence, the warpage issue can be further mitigated during the singulation operation as shown in FIG. 7F.

FIG. 8A, FIG. 8B, FIG. 8C, FIG. 8D, FIG. 8E and FIG. 8F illustrate a semiconductor manufacturing method in accordance with some embodiments of the present disclosure. The operation in FIG. 8A may be carried out after the operation in FIG. 6D. The operations as shown in FIG. 8A, FIG. 8B, FIG. 8C, FIG. 8D, FIG. 8E and FIG. 8F are similar to the operations as shown in FIG. 6D, FIG. 6E, FIG. 6F, FIG. 6G, FIG. 6H and FIG. 6I, and the differences therebetween are described below.

Figure 8A:
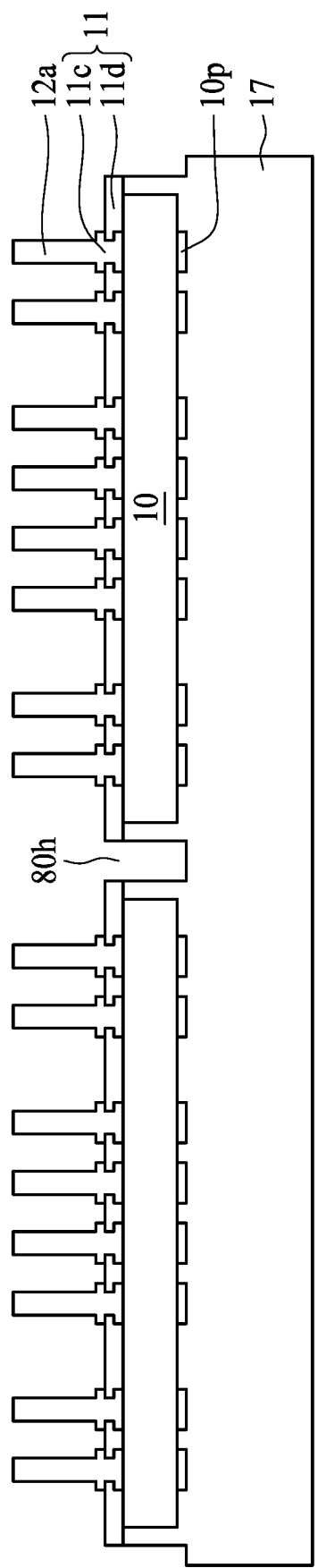
FIG. 8A, FIG. 8B, FIG. 8C, FIG. 8D, FIG. 8E and FIG. 8F illustrate a semiconductor manufacturing method in accordance with some embodiments of the present disclosure.

Referring to FIG. 8A, after the circuit layer 11 and the interconnection structures 12a are formed, a cutting operation (e.g., a half-cut operation) is carried out to form openings 80h to divide the circuit layer 11 into a plurality of individual circuit layers. The divided circuit layers 11 are separated from each other. For example, there is a gap or distance between any two adjacent circuit layers 11. In some embodiments, a width of the circuit layer 11 is substantially the same as a width of the corresponding carrier. Alternatively, the width of the circuit layer 11 is greater than the width of the corresponding carrier.

A portion of the package body 17 is also removed during the cutting operation. For example, the openings 80h extend into the package body 17 without penetrating the package body 17.

Figure 8B:
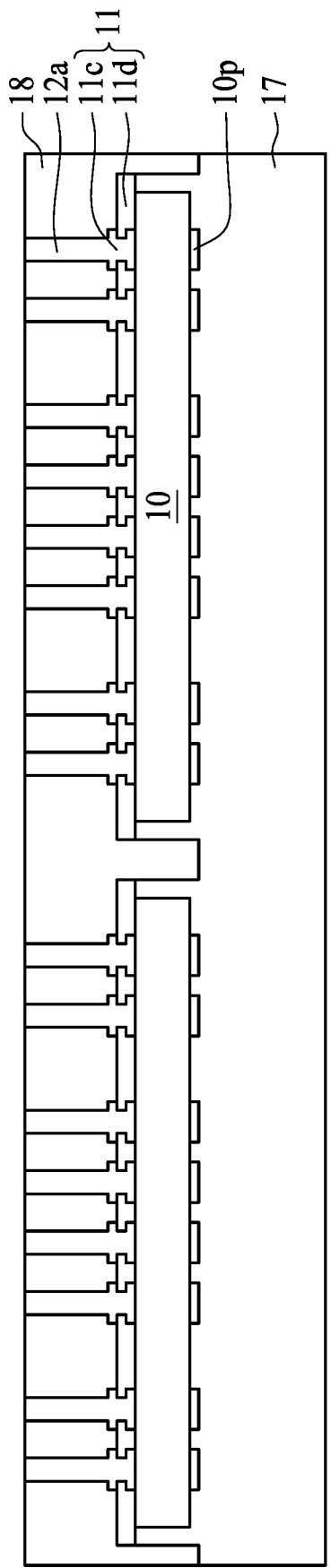
Figure 8C:
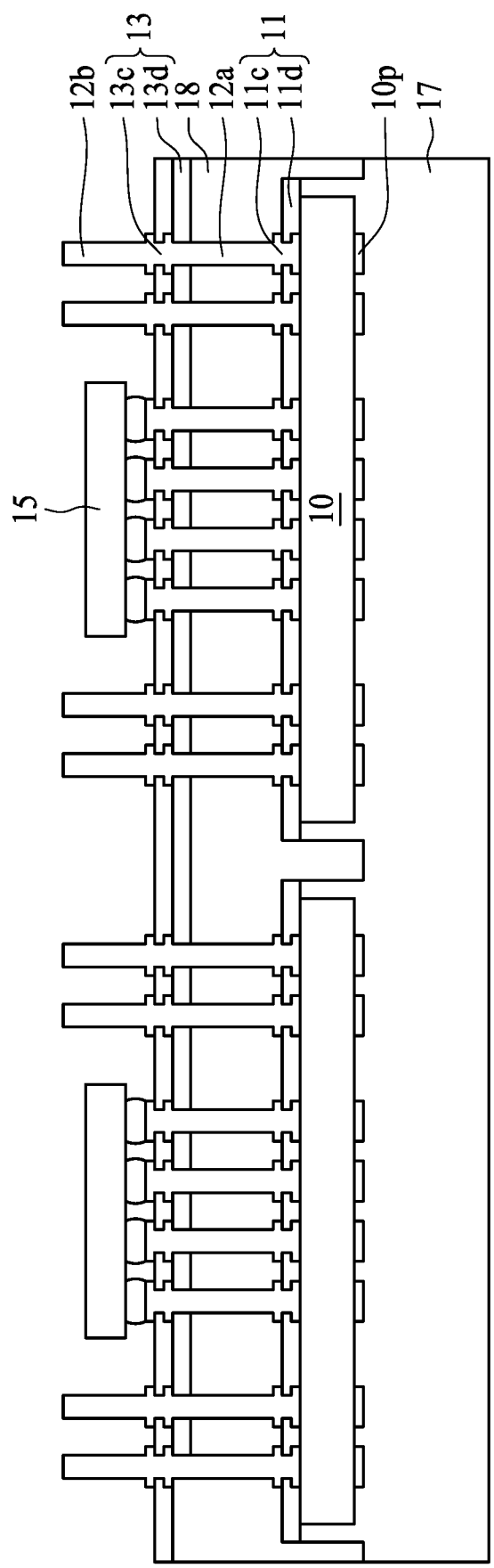
Figure 8D:
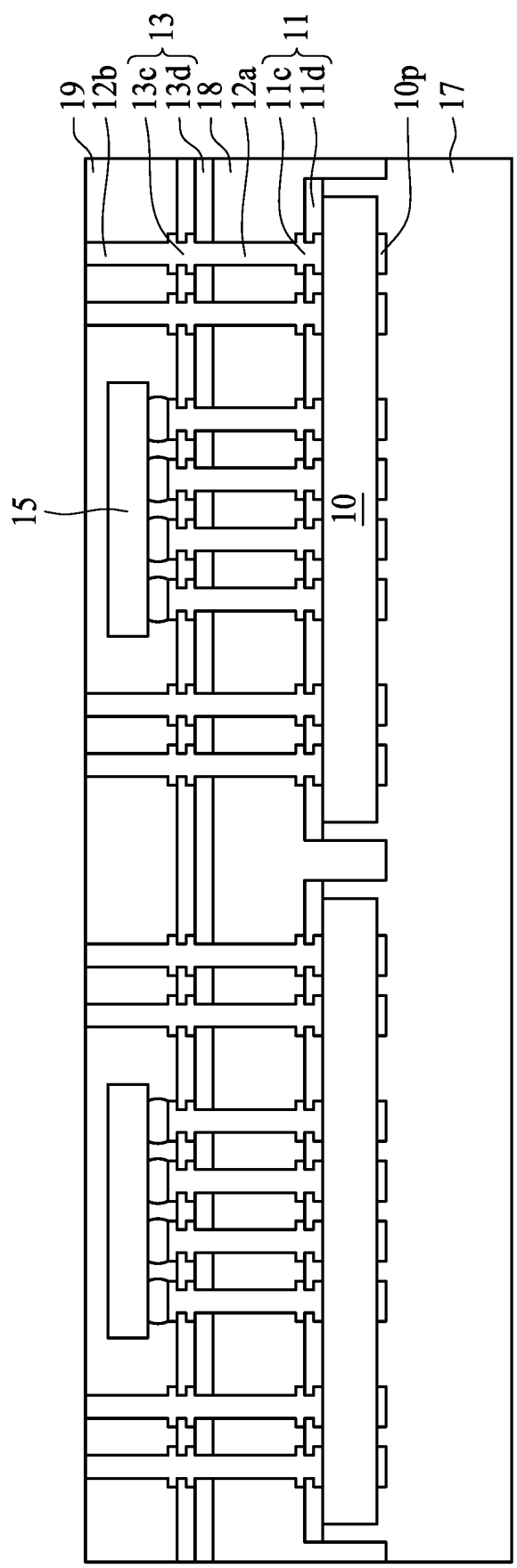
Figure 8E:
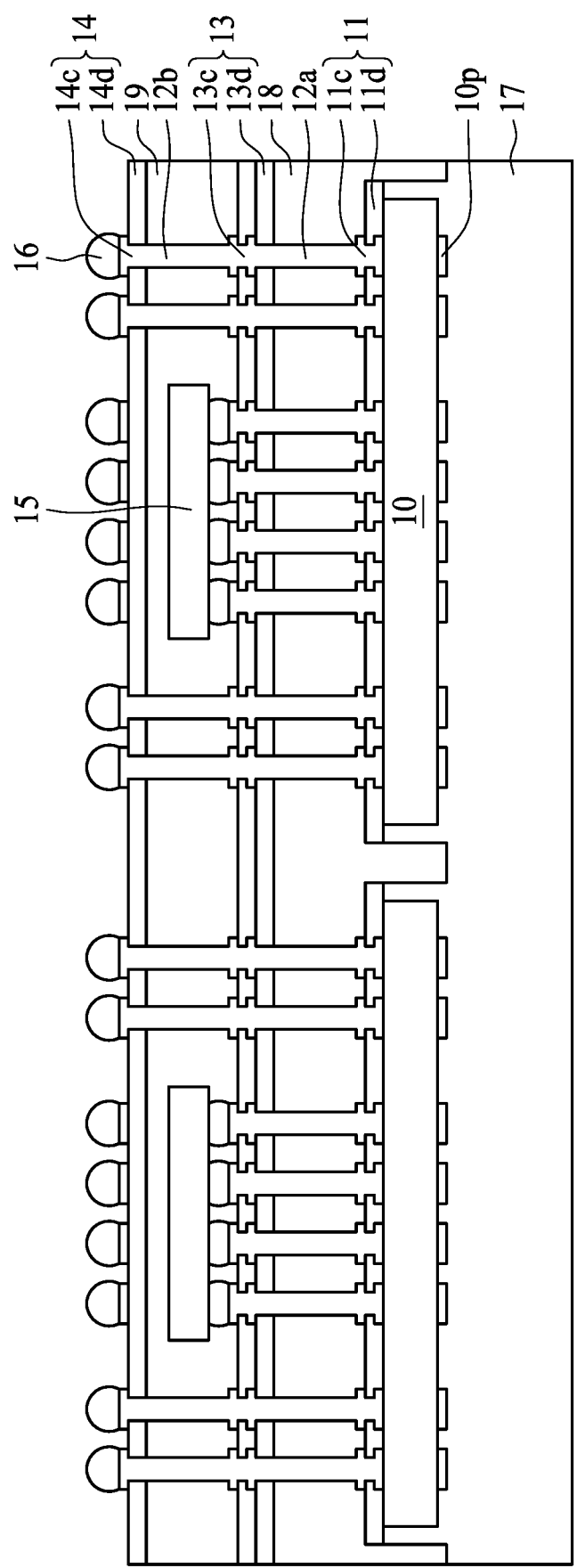

Referring to FIG. 8B, a package body 18 is form on the circuit layer 11 and within the openings 80h to cover the interconnection layers 12a. The package body 18 is in contact with the lateral surface of the circuit layer 11 and the package body 17. The package body 18 is in contact with bottom sides and sidewalls of the openings 80h.

Figure 8F:
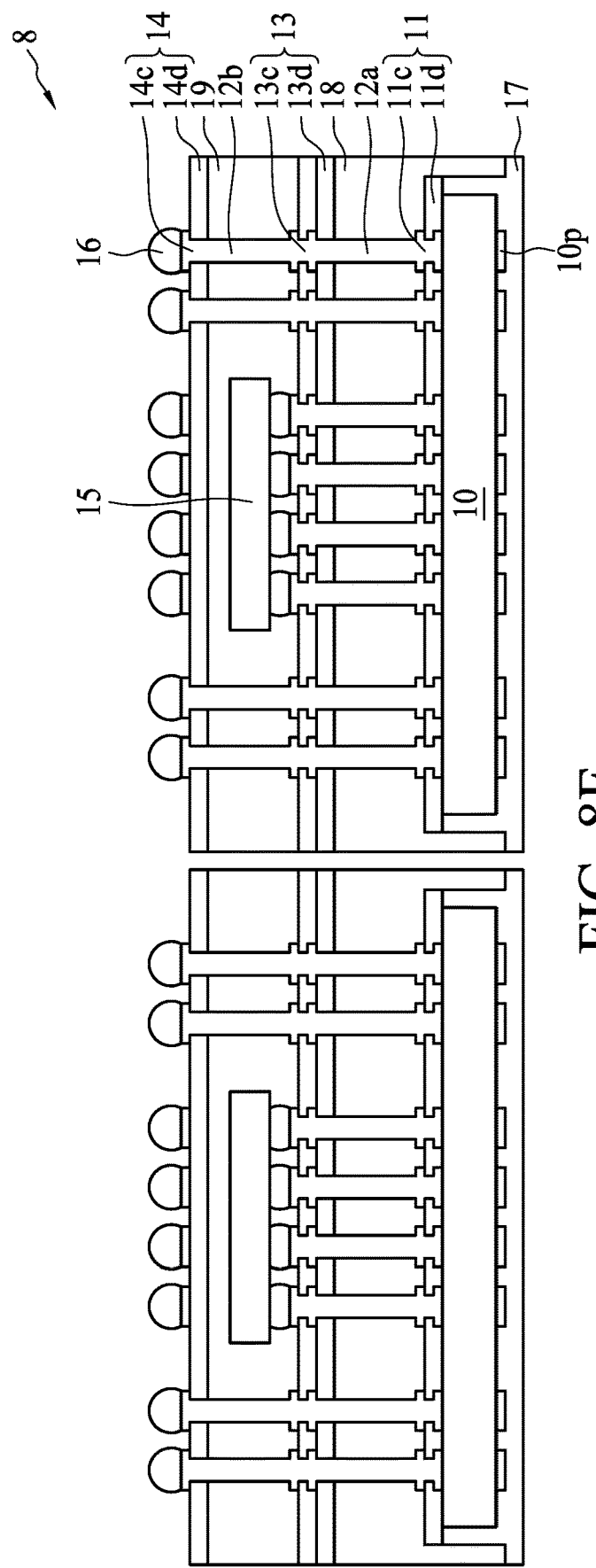

After the singulation operation to form a semiconductor device package 8 as illustrated in FIG. 8F, the package body 17 may define a recess or a step structure (which is a portion of the opening 80h), and the package body 18 extends within the recess. For example, the package body 17 may include a first top surface substantially coplanar with a top surface of the carrier 10 and a second top surface in contact with the package body 18. For example, the package body 17 may include a first lateral surface in contact with the package body 18 and a second lateral surface exposed from the package body 18. In some embodiments, the second lateral surface of the package body 17 is substantially coplanar with a lateral surface of the package body 18.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a carrier having a first surface, a second surface opposite to the first surface and a lateral surface extending from the first surface to the second surface;
   an emitting element disposed on the first surface of carrier;
   a first building-up circuit disposed on the second surface of the carrier;
   a first package body encapsulating the lateral surface of the carrier;
   a first set of conductive pillars disposed on the first building-up circuit; and
   a second package body covering the first set of conductive pillars,
   wherein the lateral surface of the carrier is recessed from a lateral surface of the first building-up circuit.

2. The semiconductor device package of claim 1, wherein the lateral surface of the carrier is substantially coplanar with the lateral surface of the first building-up circuit.

3. The semiconductor device package of claim 2, further comprising a first package body encapsulating the lateral surface of the carrier, wherein the first package body covers the lateral surface of the first building-up circuit.

4. The semiconductor device package of claim 1, wherein the first building-up circuit includes a redistribution layer, and a portion of the redistribution layer aligns with the emitting element.

5. The semiconductor device package of claim 1, wherein the carrier includes a glass material.

6. The semiconductor device package of claim 1, wherein the first package body has an opening adjacent to the lateral surface of the carrier, and the second package body is disposed in the opening.

7. The semiconductor device package of claim 1, further comprising:
   a second building-up circuit disposed on the second package body;
   a second set of conductive pillars disposed on the second building-up circuit; and
   a third package body disposed on the second building-up circuit and covering the second set of conductive pillars.

8. The semiconductor device package of claim 7, further comprising an electronic component disposed on the second building-up circuit and covered by the third package body, the electronic component having an active surface facing the second building-up circuit and electrically connected to the second building-up circuit.

9. The semiconductor device package of claim 8, wherein
   the second building-up circuit includes a first portion adjacent to the second package body and a second portion adjacent to the third package body;
   the first portion of the second building-up circuit is spaced apart from the second portion of the second building-up circuit and electrically connected to the second portion of the second building-up circuit through electrical contacts; and
   the electrical contacts are covered by an underfill.

10. A semiconductor device package, comprising:
    a carrier having a first surface, a second surface opposite to the first surface and a lateral surface extending from the first surface to the second surface;
    an antenna disposed on the first surface of the carrier;
    a first building-up circuit disposed on the second surface of the carrier, wherein a lateral surface of the first building-up circuit and the lateral surface of the carrier stand-off layer are non-coplanar;
    a first set of conductive pillars disposed on the first building-up circuit;
    a first package body covering the first set of conductive pillars; and
    a second package body having an opening adjacent to the lateral surface of the carrier and the first package body is disposed in the opening and covers the lateral surface of the first building-up circuit.

11. The semiconductor device package of claim 10, further comprising a package body covering the lateral surface of the carrier and exposing the first building-up circuit.

12. The semiconductor device package of claim 10, further comprising:
    a second building-up circuit disposed on the first package body;
    a second set of conductive pillars disposed on the second building-up circuit; and
    a third package body disposed on the second building-up circuit and covering the second set of conductive pillars.

13. The semiconductor device package of claim 12, further comprising an electronic component disposed on the second building-up circuit and covered by the third package body, the electronic component having an active surface facing the second building-up circuit and electrically connected to the second building-up circuit.

14. A method of manufacturing a semiconductor device package, the method comprising:

providing a plurality of antenna devices separated from each other;

forming a first package body to encapsulate lateral surfaces of the antenna emitting devices; and forming a first building-up circuit on the antenna devices;

removing a portion of the first package body to form an opening adjacent to a lateral surface of the first building-up circuit; and disposing a second package body in the opening to cover the lateral surface of the first building-up circuit.

15. The method of claim 14, further comprising:

forming a first set of conductive pillars on the first building-up circuit to be electrically connected to the first building-up circuit, wherein the second package body is disposed on the first building-up circuit to cover the first set of conductive pillars and to expose a top surface of the first set of conductive pillars.

* * * * *